US012620530B2

(12) United States Patent
Kam et al.

(10) Patent No.: US 12,620,530 B2
(45) Date of Patent: May 5, 2026

(54) DEVICE AND PROCESS FOR IMPLEMENTING SILICON CARBIDE (SiC) SURFACE MOUNT DEVICES

(71) Applicant: WOLFSPEED, INC., Durahm, NC (US)

(72) Inventors: Kok Meng Kam, Ipoh (MY); Eng Wah Woo, Ipoh (MY); Samantha Cheang, Ipoh (MY); Marvin Marbell, Cary, NC (US); Haedong Jang, San Jose, CA (US); Jeremy Fisher, Raleigh, NC (US); Basim Noori, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 625 days.

(21) Appl. No.: 17/951,523

(22) Filed: Sep. 23, 2022

(65) Prior Publication Data

US 2024/0105390 A1     Mar. 28, 2024

(51) Int. Cl.
| | |
|---|---|
| *H01G 4/228* | (2006.01) |
| *H10D 1/68* | (2025.01) |
| *H10W 20/20* | (2026.01) |
| *H10W 90/00* | (2026.01) |
| *H10W 72/00* | (2026.01) |
| *H10W 72/90* | (2026.01) |

(52) U.S. Cl.
CPC ............. *H01G 4/228* (2013.01); *H10D 1/692* (2025.01); *H10W 20/20* (2026.01); *H10W 90/00* (2026.01); *H10W 72/07336* (2026.01); *H10W 72/921* (2026.01); *H10W 72/952* (2026.01); *H10W 90/734* (2026.01)

(58) Field of Classification Search
CPC ..... H01L 23/482; H01L 23/488; H01L 21/50; H01L 21/768
See application file for complete search history.

(56) References Cited

U.S. PATENT DOCUMENTS

| | | | |
|---|---|---|---|
| 34,861 | A | 4/1862 | Knowlton |
| 4,605,153 | A | 8/1986 | Van Den Brekel et al. |
| 4,946,547 | A | 8/1990 | Palmour et al. |

(Continued)

FOREIGN PATENT DOCUMENTS

| | | |
|---|---|---|
| CA | 2511005 C | 5/2016 |
| CN | 1412838 A | 4/2003 |

(Continued)

OTHER PUBLICATIONS

International Patent Application No. PCT/US2023/074772; Int'l Search Report and the Written Opinion; dated Mar. 28, 2024; 15 pages.

(Continued)

*Primary Examiner* — Dale E Page
*Assistant Examiner* — Wilner Jean Baptiste
(74) *Attorney, Agent, or Firm* — BakerHostetler

(57) ABSTRACT

In some aspects, a device includes a substrate. A first metallization arranged on the substrate. A second metallization arranged on the substrate. A circuit arranged on the substrate and electrically connected to the first metallization and the second metallization. The first metallization and the second metallization being configured, structured, and arranged to make a solder connection to a device, where the substrate may include silicon carbide (SiC).

32 Claims, 15 Drawing Sheets

(56) References Cited

U.S. PATENT DOCUMENTS

| | | | |
|---|---|---|---|
| 4,979,015 | A | 12/1990 | Stierman et al. |
| 5,192,987 | A | 3/1993 | Khan et al. |
| 5,200,022 | A | 4/1993 | Kong et al. |
| 5,210,051 | A | 5/1993 | Carter |
| 5,296,395 | A | 3/1994 | Khan et al. |
| 5,309,012 | A | 5/1994 | Jex et al. |
| RE34,861 | E | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter et al. |
| 6,316,793 | B1 | 11/2001 | Sheppard et al. |
| 6,426,525 | B1 | 7/2002 | Brindle |
| 6,548,333 | B2 | 4/2003 | Smith |
| 6,825,559 | B2 | 11/2004 | Mishra et al. |
| 7,030,428 | B2 | 4/2006 | Saxler |
| 7,078,310 | B1 | 7/2006 | Kar-Roy et al. |
| 7,135,766 | B1 | 11/2006 | Costa et al. |
| 7,259,402 | B2 | 8/2007 | Edmond et al. |
| 7,291,529 | B2 | 11/2007 | Slater, Jr. et al. |
| 7,354,782 | B2 | 4/2008 | Mishra et al. |
| 7,544,963 | B2 | 6/2009 | Saxler |
| 7,548,112 | B2 | 6/2009 | Sheppard |
| 7,592,211 | B2 | 9/2009 | Sheppard et al. |
| 7,615,774 | B2 | 11/2009 | Saxler |
| 7,709,269 | B2 | 5/2010 | Smith et al. |
| 7,768,075 | B2 | 8/2010 | Yilmaz et al. |
| 7,851,909 | B2 | 12/2010 | Mishra et al. |
| 7,906,799 | B2 | 3/2011 | Sheppard et al. |
| 7,932,111 | B2 | 4/2011 | Edmond |
| 8,138,087 | B2 | 3/2012 | Morel et al. |
| 8,143,699 | B2 | 3/2012 | Ching et al. |
| 8,252,682 | B2 | 8/2012 | Yang et al. |
| 8,274,159 | B2 | 9/2012 | Mishra et al. |
| 8,513,686 | B2 | 8/2013 | Edmond |
| 8,803,313 | B2 | 8/2014 | Mishra et al. |
| 9,153,504 | B2 | 10/2015 | Lai et al. |
| 9,226,383 | B2 | 12/2015 | Mishra et al. |
| 9,515,011 | B2 | 12/2016 | Wood et al. |
| 9,780,738 | B2 | 10/2017 | Ota |
| 9,947,616 | B2 | 4/2018 | Wood et al. |
| 9,966,426 | B2 | 5/2018 | Mudakatte et al. |
| 10,103,233 | B1 | 10/2018 | Khalil et al. |
| 10,147,686 | B1 | 12/2018 | Lessard et al. |
| 10,290,701 | B1 | 5/2019 | Chang |
| 10,483,352 | B1 | 11/2019 | Mokhti et al. |
| 10,574,198 | B2 | 2/2020 | Shilimkar et al. |
| 11,094,614 | B2 | 8/2021 | Steinhoff |
| 11,257,740 | B2 | 2/2022 | Komposch et al. |
| 11,990,872 | B2 | 5/2024 | Tucker et al. |
| 12,230,614 | B2 | 2/2025 | Marbell et al. |
| 12,439,834 | B2 * | 10/2025 | Abdo ..................... H10N 69/00 |
| 2001/0038310 | A1 | 11/2001 | Olofsson et al. |
| 2002/0066908 | A1 | 6/2002 | Smith et al. |
| 2002/0167023 | A1 | 11/2002 | Chavarkar et al. |
| 2003/0102482 | A1 | 6/2003 | Saxler |
| 2003/0155661 | A1 | 8/2003 | Auburger et al. |
| 2004/0056277 | A1 | 3/2004 | Karnezos |
| 2004/0061129 | A1 | 4/2004 | Saxler et al. |
| 2004/0061214 | A1 | 4/2004 | Crescenzi |
| 2004/0130037 | A1 | 7/2004 | Mishra et al. |
| 2005/0040522 | A1 | 2/2005 | Takehara et al. |
| 2005/0121744 | A1 | 6/2005 | Chang et al. |
| 2005/0230797 | A1 | 10/2005 | Ho et al. |
| 2006/0081985 | A1 | 4/2006 | Beach et al. |
| 2006/0226498 | A1 | 10/2006 | Davies |
| 2007/0290310 | A1 | 12/2007 | Kusano et al. |
| 2007/0297120 | A1 | 12/2007 | Ren et al. |
| 2008/0083954 | A1 | 4/2008 | Tokunaga |
| 2008/0169474 | A1 | 7/2008 | Sheppard |
| 2009/0256266 | A1 | 10/2009 | Lao et al. |
| 2010/0059791 | A1 | 3/2010 | Takagi |
| 2010/0059879 | A1 | 3/2010 | Bielen |
| 2010/0178879 | A1 | 7/2010 | Sato et al. |
| 2010/0244193 | A1 | 9/2010 | Lin et al. |
| 2011/0024835 | A1 | 2/2011 | Tiemeijer |
| 2011/0031586 | A1 | 2/2011 | Kang et al. |
| 2011/0241074 | A1 | 10/2011 | Okamoto |
| 2011/0248293 | A1 * | 10/2011 | Chan ..................... H10H 20/857 |
| | | | 257/E33.056 |
| 2012/0063097 | A1 | 3/2012 | Reza et al. |
| 2012/0104427 | A1 | 5/2012 | Chan et al. |
| 2012/0104577 | A1 | 5/2012 | Fukumura et al. |
| 2012/0139095 | A1 | 6/2012 | Manusharow et al. |
| 2012/0140432 | A1 | 6/2012 | Andrei |
| 2012/0167033 | A1 | 6/2012 | Cases et al. |
| 2012/0168928 | A1 | 7/2012 | Lao et al. |
| 2012/0256189 | A1 | 10/2012 | McDonald et al. |
| 2012/0280755 | A1 | 11/2012 | Wright |
| 2013/0264716 | A1 | 10/2013 | Lin et al. |
| 2013/0284507 | A1 | 10/2013 | Hattori et al. |
| 2013/0341656 | A1 | 12/2013 | Chan et al. |
| 2014/0036405 | A1 | 2/2014 | Takeoka et al. |
| 2014/0264799 | A1 | 9/2014 | Gowda et al. |
| 2014/0312458 | A1 | 10/2014 | Ashrafzadeh et al. |
| 2014/0332941 | A1 | 11/2014 | Viswanathan et al. |
| 2014/0346569 | A1 | 11/2014 | Vielemeyer et al. |
| 2015/0244410 | A1 | 8/2015 | Leong et al. |
| 2015/0249021 | A1 | 9/2015 | Sanchez et al. |
| 2015/0303881 | A1 | 10/2015 | Blednov et al. |
| 2015/0310981 | A1 | 10/2015 | Yen et al. |
| 2016/0087588 | A1 | 3/2016 | Szymanowski et al. |
| 2016/0090294 | A1 | 3/2016 | Wachter et al. |
| 2016/0126173 | A1 | 5/2016 | Kim et al. |
| 2016/0126905 | A1 | 5/2016 | Zhao et al. |
| 2016/0240471 | A1 | 8/2016 | Klowak et al. |
| 2017/0034913 | A1 | 2/2017 | Mu et al. |
| 2017/0084482 | A1 * | 3/2017 | Ory ..................... H01L 21/3043 |
| 2017/0117239 | A1 | 4/2017 | Lembeye et al. |
| 2017/0243812 | A1 | 8/2017 | Kadoguchi et al. |
| 2017/0271258 | A1 | 9/2017 | Wood et al. |
| 2017/0271497 | A1 | 9/2017 | Fayed et al. |
| 2017/0287820 | A1 | 10/2017 | Ahlers et al. |
| 2017/0372945 | A1 | 12/2017 | Howard et al. |
| 2017/0372983 | A1 | 12/2017 | Howard |
| 2017/0373645 | A1 | 12/2017 | Jang et al. |
| 2018/0040537 | A1 | 2/2018 | Grassmann et al. |
| 2018/0090475 | A1 | 3/2018 | Zuo et al. |
| 2018/0096922 | A1 | 4/2018 | Chen |
| 2018/0114741 | A1 | 4/2018 | Gagné et al. |
| 2018/0122750 | A1 | 5/2018 | Lu |
| 2018/0131329 | A1 | 5/2018 | Tong |
| 2018/0175802 | A1 | 6/2018 | Wu et al. |
| 2018/0182717 | A1 | 6/2018 | Shilimkar et al. |
| 2018/0323159 | A1 | 11/2018 | Kamgaing et al. |
| 2018/0323295 | A1 | 11/2018 | Okayasu et al. |
| 2019/0057924 | A1 | 2/2019 | Kim et al. |
| 2019/0109222 | A1 | 4/2019 | Liu et al. |
| 2019/0110358 | A1 | 4/2019 | Mu et al. |
| 2019/0149098 | A1 | 5/2019 | Tanomura |
| 2019/0173195 | A1 | 6/2019 | Kim et al. |
| 2019/0173430 | A1 | 6/2019 | Krehbiel et al. |
| 2019/0181099 | A1 | 6/2019 | Then et al. |
| 2019/0280374 | A1 | 9/2019 | Kim et al. |
| 2019/0304887 | A1 | 10/2019 | Ganesan et al. |
| 2019/0326233 | A1 | 10/2019 | Uscola |
| 2019/0326258 | A1 | 10/2019 | Hua et al. |
| 2019/0333878 | A1 | 10/2019 | Wu et al. |
| 2020/0013692 | A1 | 1/2020 | Formicone |
| 2020/0021046 | A1 | 1/2020 | Kermalli et al. |
| 2020/0027849 | A1 | 1/2020 | Trang et al. |
| 2020/0075479 | A1 | 3/2020 | Khalil et al. |
| 2020/0091608 | A1 | 3/2020 | Alpman et al. |
| 2020/0105653 | A1 | 4/2020 | Elsherbini et al. |
| 2020/0105741 | A1 | 4/2020 | Lin et al. |
| 2020/0204119 | A1 | 6/2020 | Roberts et al. |
| 2020/0219866 | A1 | 7/2020 | Cabahug et al. |
| 2020/0227366 | A1 | 7/2020 | Dogiamis et al. |
| 2020/0328721 | A1 | 10/2020 | Nanan et al. |
| 2020/0395474 | A1 | 12/2020 | Bothe et al. |
| 2020/0411555 | A1 | 12/2020 | Hall et al. |
| 2021/0028122 | A1 | 1/2021 | Son et al. |
| 2021/0111105 | A1 | 4/2021 | Kim et al. |
| 2021/0118835 | A1 | 4/2021 | Wu et al. |
| 2021/0126593 | A1 | 4/2021 | Roberts et al. |

(56) References Cited

U.S. PATENT DOCUMENTS

| | | | |
|---|---|---|---|
| 2021/0175860 A1 | 6/2021 | Roberts et al. |
| 2021/0175866 A1 | 6/2021 | Li et al. |
| 2021/0194434 A1 | 6/2021 | Ladhani et al. |
| 2021/0202408 A1 | 7/2021 | Khalil et al. |
| 2021/0225784 A1 | 7/2021 | Shilimkar et al. |
| 2021/0265249 A1 | 8/2021 | Komposch et al. |
| 2021/0265250 A1 | 8/2021 | Marbell et al. |
| 2021/0313282 A1 | 10/2021 | Noori et al. |
| 2021/0313284 A1 | 10/2021 | Noori et al. |
| 2021/0313285 A1 | 10/2021 | Noori et al. |
| 2021/0313293 A1 | 10/2021 | Noori et al. |
| 2021/0336585 A1 | 10/2021 | Mares et al. |
| 2021/0376807 A1 | 12/2021 | Lim et al. |
| 2021/0391234 A1 | 12/2021 | Lan et al. |
| 2022/0059427 A1 | 2/2022 | Kondo et al. |
| 2022/0084950 A1 | 3/2022 | Noori et al. |
| 2022/0321071 A1 | 10/2022 | Noori et al. |
| 2023/0260935 A1 | 8/2023 | Kabir et al. |
| 2023/0361726 A1 | 11/2023 | Schultz et al. |

FOREIGN PATENT DOCUMENTS

| | | | |
|---|---|---|---|
| CN | 1757119 | B | 2/2011 |
| CN | 104051376 | A | 9/2014 |
| CN | 204946885 | U | 1/2016 |
| CN | 110970423 | A | 4/2020 |
| EP | 1357596 | A2 | 10/2003 |
| EP | 1670055 | A1 | 6/2006 |
| EP | 2518764 | A2 | 10/2012 |
| EP | 2947472 | A1 | 11/2015 |
| EP | 3629373 | A1 | 4/2020 |
| EP | 3855486 | A1 | 7/2021 |
| EP | 3907756 | A1 | 11/2021 |
| JP | S64-013144 | U | 1/1989 |
| JP | H10-004325 | A | 1/1998 |
| JP | 2002-093920 | A | 3/2002 |
| JP | 2003-124435 | A | 4/2003 |
| JP | 2006-086296 | A | 3/2006 |
| JP | 4830092 | B2 | 12/2011 |
| JP | 2013-546191 | A | 12/2013 |
| JP | 2014-179612 | A | 9/2014 |
| JP | 2016-009697 | A | 1/2016 |
| JP | 2016-219542 | A | 12/2016 |
| JP | 2019-186983 | A | 10/2019 |
| JP | 6615414 | B1 | 12/2019 |
| JP | 2020-507230 | A | 3/2020 |
| KR | 2006-0103395 | A | 9/2006 |
| KR | 2012-0102819 | A | 9/2012 |
| KR | 101288153 | B1 | 7/2013 |
| KR | 101371907 | B1 | 3/2014 |
| KR | 2017-0077133 | A | 7/2017 |
| KR | 2018-0019226 | A | 2/2018 |
| TW | 1333278 | B | 11/2010 |
| TW | 201519379 | A | 5/2015 |
| WO | WO 1999/054935 | A1 | 10/1999 |
| WO | WO 2004/061973 | A1 | 7/2004 |
| WO | WO 2009/097564 | A1 | 8/2009 |
| WO | WO 2017/187559 | A1 | 11/2017 |
| WO | WO 2019/066878 | A1 | 4/2019 |
| WO | WO 2019/097564 | A1 | 5/2019 |
| WO | WO 2019/170045 | A1 | 9/2019 |
| WO | WO 2020/100219 | A1 | 5/2020 |
| WO | WO 2021/167822 | A1 | 8/2021 |
| WO | WO 2021/202076 | A1 | 10/2021 |
| WO | WO 2022/078725 | A1 | 4/2022 |

OTHER PUBLICATIONS

U.S. Appl. No. 63/004,985, filed Apr. 3, 2020, Marbell et al.

The definition of Redistribution Layers (RDLs), https://semiengineering.com/knowledge_centers/packaging/redistribution-layers-rdls/; Semiconductor Engineering; © 2013; accessed Nov. 20, 2025; 5 pages.

Jin et al.; "Next generation eWLB (embedded wafer level BGA) packaging"; 12th Electronics Packaging Technology Conference; 2010; p. 520-526.

\* cited by examiner

600 PROCESS OF IMPLEMENTING AT LEAST ONE SIC SMD COMPONENT

602 FORMING THE SUBSTRATE

604 FORMING THE METALLIZATION LAYER

606 FORMING THE DIELECTRIC

DEVICE AND PROCESS FOR IMPLEMENTING SILICON CARBIDE (SiC) SURFACE MOUNT DEVICES

FIELD OF THE DISCLOSURE

The disclosure relates to silicon carbide (SiC) surface mount devices. The disclosure also relates to a process of implementing silicon carbide (SiC) surface mount devices. The disclosure relates to a device implementing silicon carbide (SiC) surface mount devices. The disclosure further relates to a process for implementing a device implementing silicon carbide (SiC) surface mount devices.

BACKGROUND OF THE DISCLOSURE

Typically, SiC based components are attached to a metal surface using an epoxy material, a silver (Ag) material, a Gold-Tin (AuSn) material, other dispensed attach material, and/or the like. For example, SiC based components are typically attached to a metal flange of a device using an epoxy material, an Ag sinter material, a pre-attached AuSn material backside material, other dispensed attach material, and/or the like. These materials typically require a large dispense nozzle in order to dispense material in the desired location. However, the large dispense nozzle requires a larger dispense area and accordingly requires a larger component.

Accordingly, use of a dispensed material, such as an epoxy material, is not easily implemented for smaller form factor SiC based components, which increases device cost. Moreover, use of a dispensed material, such as an epoxy material, requires a cure temperature that can be as high as 400 C. This higher cure temperature reduces device reliability, device ruggedness, increases device cost, and/or the like.

Furthermore, utilizing a dispensed material, such as an epoxy material, requires more exacting placement of SiC based components. In this regard, the SiC based components must be placed in the exact location prior to curing, which increases device cost and manufacturing time.

Accordingly, what is needed is SiC based components configured to implement an improved attachment and an improved attachment process to reduce cost, manufacturing time and/or the like.

SUMMARY OF THE DISCLOSURE

In one general aspect, a silicon carbide surface mount device includes a substrate; a first metallization arranged on the substrate; a second metallization arranged on the substrate; a circuit arranged on the substrate and electrically connected to the first metallization and the second metallization; and the first metallization and the second metallization being configured, structured, and arranged to make a solder connection to a device. The silicon carbide surface mount device in addition includes where the substrate may include silicon carbide (SiC).

In one general aspect, a process includes providing a substrate; arranging a first metallization on the substrate; arranging a second metallization on the substrate; arranging a circuit electrically connected to the first metallization and the second metallization; and reflowing a solder to connect the first metallization and the second metallization to a device. The process in addition includes where the substrate may include silicon carbide (SiC).

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
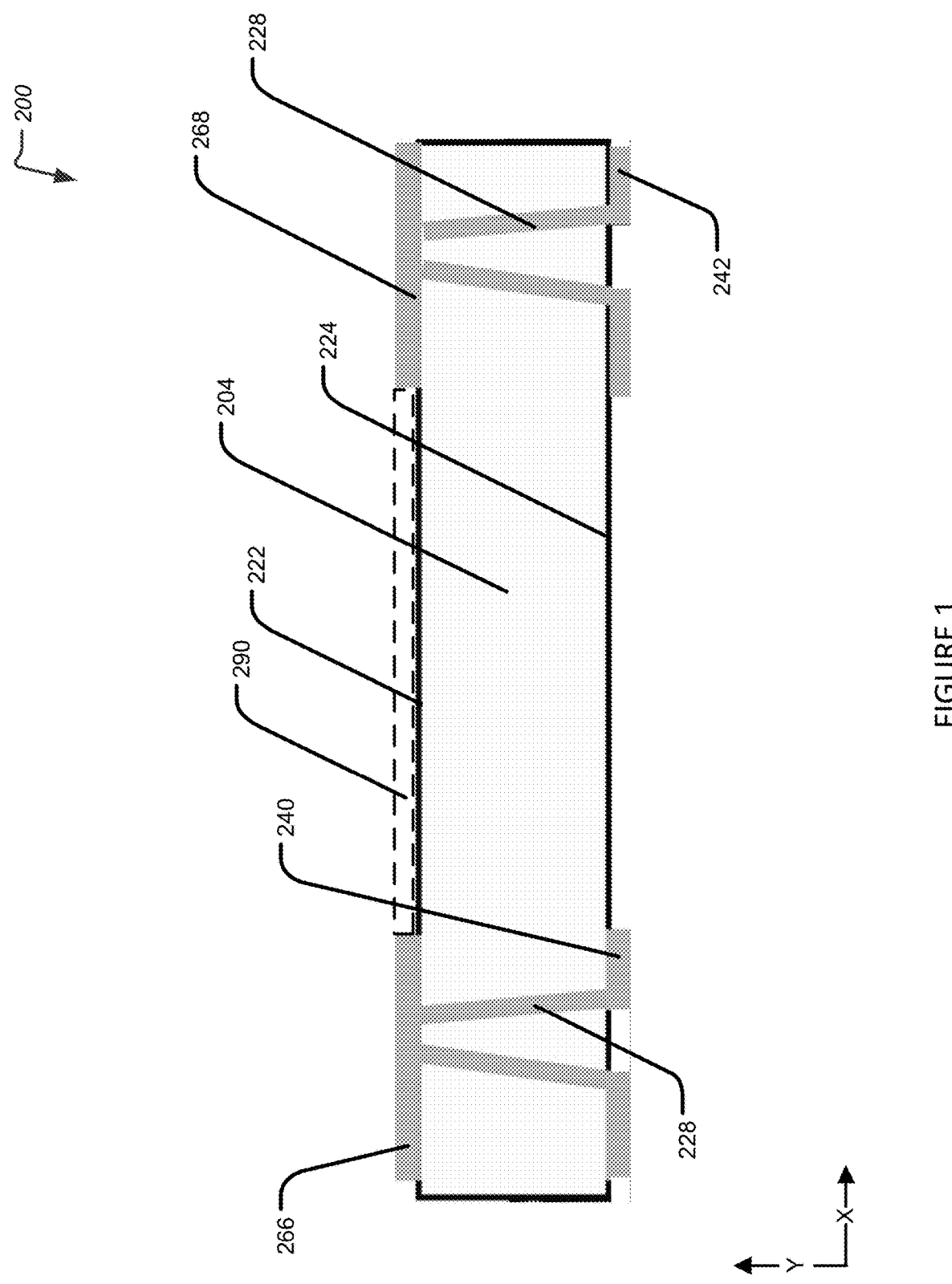
FIG. 1 illustrates a cross-sectional side view of a SiC SMD component according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects of the disclosure are directed to a SiC component and/or a device on a SiC substrate. The SiC component and/or the device on a SiC substrate may be implemented as a capacitor, a spiral inductor, a transmission line, and/or the like. The SiC component and/or the device on a SiC substrate may include a patterned bottom-side metallization that may be attached to a support, such as PCB (Printed Circuit Board), using a standard solder reflow method and equipment. As opposed to epoxy attach method or other dispensed attach material, which requires a large dispense nozzle, a larger dispense area, and a larger component.

Aspects of the disclosed SiC component and/or the device on a SiC substrate may utilize a solder reflow method to attach these smaller components with greater accuracy. Aspects of the disclosed SiC component and/or the device on a SiC substrate may utilize a self-aligning nature of a solder reflow method. Moreover, aspects of the disclosed SiC component and/or the device on a SiC substrate may utilize a self-aligning nature of a solder reflow method, which may be combined with appropriately designed solder mask on a support, such as a PCB, that may allow for more accurate attach placement of the disclosed SiC component and/or the device on a SiC substrate, smaller placement tolerances of the disclosed SiC component and/or the device on a SiC substrate, and/or the like.

In addition, a lower temperature profile of solder reflow, which may be approximately 260 C., is less harsh on the SiC component and/or the device on a SiC substrate. Accordingly, the disclosed implementations of the SiC component and/or the device on a SiC substrate improve device reliability, device ruggedness, device assembly cost, and/or the like of the attach as compared to epoxy attach, which can need curing temperatures as high as 400 C.

Currently, SiC based components are attached to a metal flange of a packaged RF device using an epoxy material, Ag sinter material, pre-attached AuSn backside material, and/or the like. On the other hand, the disclosure is directed to a SiC component that may be attached onto a support, such as a PCB, which may have routed transmission lines, vias, solder mask, and/or the like. The solder can be applied with screen printing method, a stencil method, and/or the like onto a large PCB panel or other support, and several SiC components may be placed and reflowed at the same time. Accordingly, attaching multiple components, for example in a batch, versus having to sequentially dispense epoxy for each component attach. This reduces assembly time and cost.

Aspects of the SiC component can have patterned bottom-side metallization. In aspects, the patterned bottom-side metallization may mimic and/or form leads consistent with typical ceramic surface mount device (SMDs). The disclosed SiC components can be designed, configured, implemented, and/or the like to replicate standard SMD component sizes. For example, SMD Package Type 0603 (Dimensions (mm)—1.5×0.8), SMD Package Type 0402 (Dimensions (mm)—1.0×0.5), SMD Package Type 0201 (Dimensions (mm)—0.6×0.3), and/or the like including SMD Package Type 2920, SMD Package Type 2512, SMD Package Type 2010, SMD Package Type 1825, SMD Package Type 1812, SMD Package Type 1806, SMD Package Type 1210, SMD Package Type 1206, SMD Package Type 0805, SMD Package Type 01005, and/or the like. Accordingly, the disclosed SiC components provide a high temperature capability, a high voltage capability, a low-loss capability, a high-Q capability, and/or the like replacement for standard SMDs. Moreover, the disclosed SiC components may also be designed to any custom size, aspect ratio, footprint, and/or the like as needed.

Aspects of the SiC component may be configured as a surface mounted SiC Device, such as surface mounted SiC Device arranged on SiC substrate, that may be attached onto a substrate, such as PCB, using a solder reflow method instead of epoxy or the like.

Aspects of the SiC component may be configured with a patterned bottom side that may be configured in the size and/or form factor of standard SMD units, but the size of the SiC component can also be in customized to any size/aspect ratio or foot-print.

Aspects of the SiC component may be configured to use a solder reflow method instead of epoxy attach. In this regard, the SiC component overcomes some problems with attach of small size and/or small aspect ratio SMDs. Lower temperature budget of solder reflow (compared to epoxy cure) also has reliability and cost advantages.

Aspects of the SiC component may be configured to use a solder mask outline to self-align and center the SIC SMD during attach process.

Aspects of the SiC component may be configured to offer an improved alternative. In this regard, aspects of the SiC component may be configured for higher power handling, better reliability, better thermals, and/or the like. Further, aspects of the SiC component may be configured to standard outline SMDs such as the SMD Package Types described herein.

Aspects of the SiC component may be configured to use existing tools and knowledge for attaching SMD components on PCB. However, the existing tools and knowledge are applied to SiC components on the PCB.

Aspects of the SiC component may be configured for implementation with a tool for placing a typical SMD component on PCB, which may be re-configured to pick the SiC component from a wafer frame and attach on PCB.

Aspects of the SiC component may be configured to be placed with bottom pads contacting the PCB. Aspects of the SiC component may be configured to be flip-chipped so top pads contact PCB.

Aspects of the SiC component may be configured to use a solder reflow method that may be able to handle smaller form factor SIC IPDs in comparison to current epoxy attach methods.

Aspects of the SiC component may beneficially utilize a lower temperature profile of solder reflow, which may be less than 260 C. This may have benefits in comparison to an epoxy cure temperature, which can be as high as 400 C. Accordingly, the disclosed SiC component may be configured for better reliability, ruggedness, cost, and/or the like. In this regard, implementation with the reflow solder is cleaner, simpler, less costly, and/or the like. Further, implementation with the reflow solder may not be as good thermally. However, this is not needed for passive devices. In this regard, a surface tension of the solder tends to the lowest state of surface tension thus aligning the components. On the other hand, implementation of epoxy is unfavorable as the application is inaccurate and too large for implementation with small SMD type devices.

Aspects of the SiC component may be configured to be implemented in conjunction with a solder mask on the PCB that can be used to self-align, center, and/or the like the SiC component, and prevent solder flow over to bond-pads.

Aspects of the SiC component may be configured to be implemented with other tools, equipment, knowledge, and/ or the like common for SMD attach on PCB, can be re-applied in the attach of the SiC component onto PCB.

In aspects, the SiC SMD component has better thermal handling, higher power handling, better reliability, lifetime, and/or the like in comparison to a typical multi-layer ceramic SMD component.

Aspects of the SiC component may be configured to be implemented in any similar form factor, outline, and/or the like as standardized SMDs such as the SMD Package Types described herein, which allows for direct replacement of the SiC SMD components on PCB.

FIG. 1 illustrates a cross-sectional side view of a SiC SMD component according to the disclosure.

Figure 2:
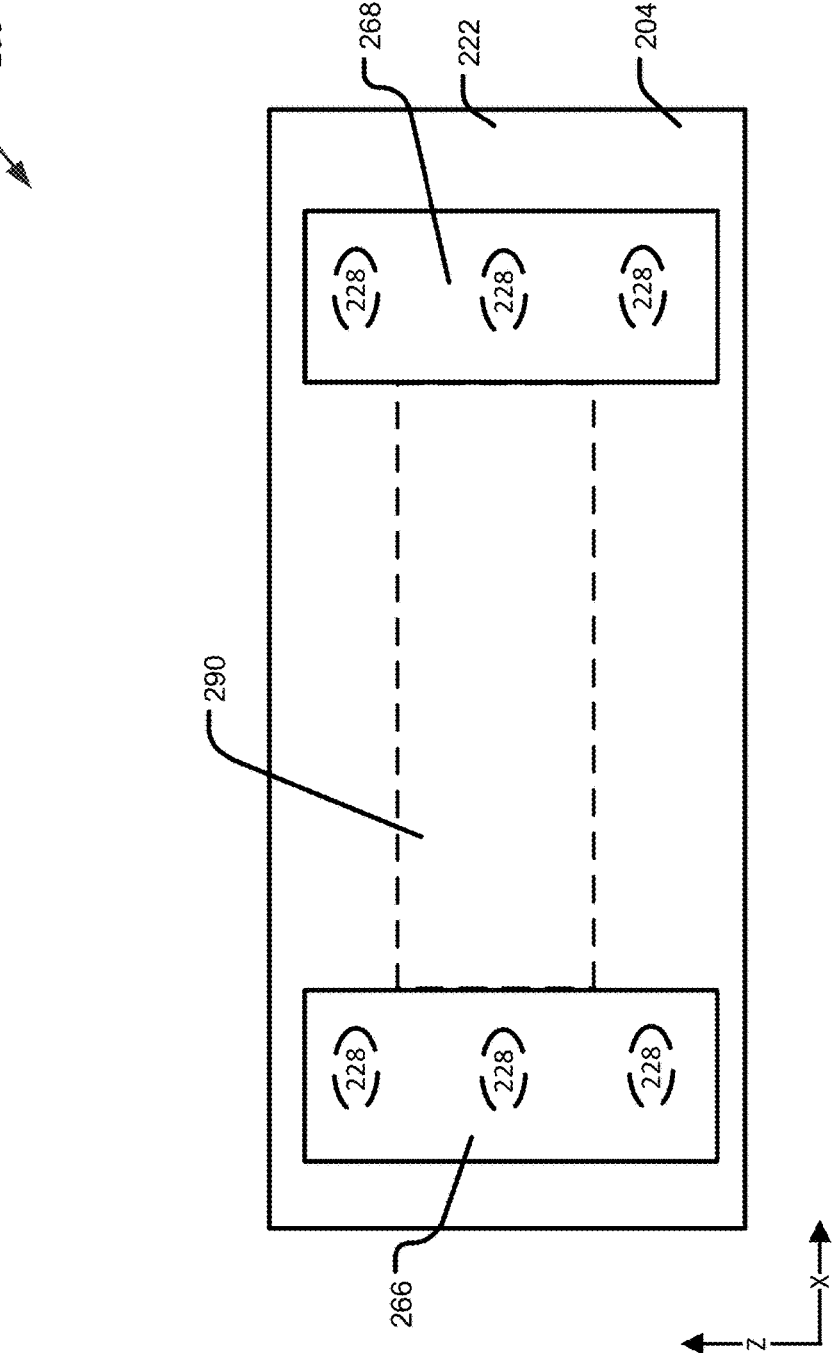
FIG. 2 illustrates a top view of the SiC SMD according to FIG. 1.

FIG. 2 illustrates a top view of the SiC SMD according to FIG. 1.

Aspects of FIG. 1 and FIG. 2 may include any one or more other features, components, arrangements, and the like as described herein. In particular, FIG. 1 illustrates at least one silicon carbide (SiC) surface mount device (SMD) component illustrated in FIG. 1 as at least one SiC SMD component 200. The at least one SiC SMD component 200 may include a substrate 204, a first top-side metallization 266, a second top-side metallization 268, a first bottom-side metallization 240, a second bottom-side metallization 242, and/or the like. Additionally, the at least one SiC SMD component 200 may include an electrical connection such as vias 228.

The first bottom-side metallization 240 and/or the second bottom-side metallization 242 of the at least one SiC SMD component 200 may be patterned on the at least one SiC SMD component 200 to replicate SMD-like leads. In this regard, a structure, an arrangement, a location, a shape, and/or the like of the first bottom-side metallization 240 and/or the second bottom-side metallization 242 replicate SMD-like leads. Accordingly, the at least one SiC SMD component 200 may be configured to be implemented in place of standard SMD type components.

Figure 12:
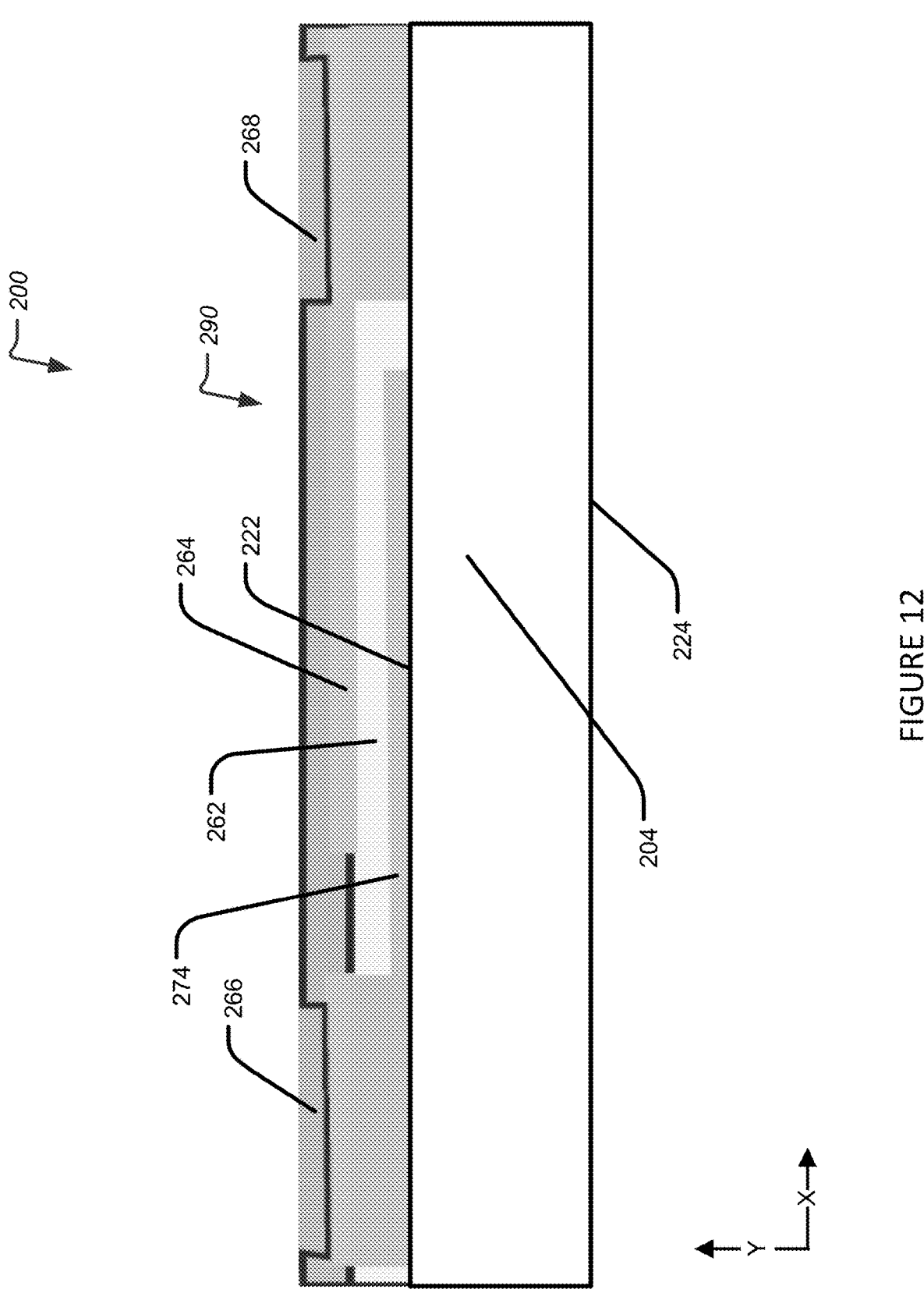
FIG. 12 illustrates a cross-sectional side view of a SiC SMD component according to the disclosure.

Additionally, in aspects the at least one SiC SMD component 200 may include a circuit 290. The circuit 290 may implement a capacitor, an inductor, a spiral inductor, a transmission line, a resistor, a combination thereof, and/or the like. In this regard, the circuit 290 may connect and/or electrically connect to the first top-side metallization 266 of the at least one SiC SMD component 200 and the second top-side metallization 268 of the at least one SiC SMD component 200. In aspects, the circuit 290 may include an arrangement of one or more metallizations, dielectric materials, and/or the like to implement a capacitor, an inductor, a spiral inductor, a transmission line, a resistor, combinations thereof, and/or the like. The resistor of the circuit 290 may be defined by the width, length, and/or height of a metal portion implemented as part of the circuit 290. The resistor may additionally or alternatively be implemented as a thin film resistor, a thick film resistor, a printed thin film resistor, a printed thick film resistor, and/or the like. The inductor of the circuit 290 may be defined by the width, length, and/or height of a metal portion implemented as part of the circuit 290. The inductor may be implemented as a spiral. A spiral construction of the inductor may be formed from a metal. The capacitor of the circuit 290 may include a capacitor top plate, a capacitor bottom plate, and a dielectric layer may be arranged therebetween. One example of the circuit 290 implemented as a capacitor is illustrated in FIG. 12 and is described in further detail below.

In particular aspects, the substrate 204 of the at least one SiC SMD component 200 may include the vias 228 extending along a y-axis through the substrate 204. In aspects, the y-axis may be a vertical axis. One or more of the vias 228 may be electrically connected to the first bottom-side metallization 240; and one or more of the vias 228 may be electrically connected to the second bottom-side metallization 242. Additionally, the one or more of the vias 228 may be electrically connected to the first top-side metallization 266; and the one or more the vias 228 may be electrically connected to the second top-side metallization 268. However, any type of electrical connection is contemplated.

The substrate 204 may include silicon carbide (SiC), may be made of Silicon Carbide (SiC), and/or the like. In some aspects, the substrate 204 may be a semi-insulating SiC substrate, a p-type substrate, an n-type substrate, and/or the like. In some aspects, the substrate 204 may be very lightly doped. In one aspect, the substrate 204 may be formed of SiC selected from the group of 6H, 4H, 15R, 3C SiC, or the like. In one aspect, the substrate 204 may be formed of SiC that may be semi-insulating and doped with vanadium or any other suitable dopant or undoped of high purity with defects providing the semi-insulating properties. In other aspects, the substrate 204 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material. The substrate 204 may include an upper surface 222. The upper surface 222 may support the first top-side metallization 266 and the second top-side metallization 268. In aspects, the circuit 290 may be arranged on the upper surface 222 of the at least one SiC SMD component 200.

The first top-side metallization 266 and the second top-side metallization 268 may be arranged on the upper surface 222 of the substrate 204. In particular, there may be one or more intervening layers or structures between the upper surface 222 of the substrate 204 and the first top-side metallization 266 (not shown); and there may be one or more intervening layers or structures between the upper surface 222 of the substrate 204 and the second top-side metallization 268 (not shown). In other aspects, the first top-side metallization 266 may be directly arranged on the upper surface 222 of the substrate 204. In other aspects, the second top-side metallization 268 may be directly arranged on the upper surface 222 of the substrate 204. In one aspect, the first top-side metallization 266 and/or the second top-side metallization 268 may be continuous. In one aspect, the first top-side metallization 266 and/or the second top-side metallization 268 may be discontinuous or segmented. The first top-side metallization 266 and the second top-side metallization 268 may comprise a metallic material such as copper, gold, nickel, palladium, silver, tin, a gold tin alloy, and the like, and combinations thereof. In one aspect, the first bottom-side metallization 240 may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

The circuit 290 may be arranged on the upper surface 222 of the substrate 204. In particular, there may be one or more intervening layers or structures between the upper surface 222 of the substrate 204 and the circuit 290 (not shown). In other aspects, the circuit 290 may be directly arranged on the upper surface 222 of the substrate 204. The circuit 290 may comprise in part a metallic material such as copper, gold, nickel, palladium, silver, tin, a gold tin alloy, and the like, and combinations thereof.

The substrate 204 may include a lower surface 224. The at least one SiC SMD component 200 may include the first bottom-side metallization 240 and the second bottom-side metallization 242 located on the lower surface 224 of the substrate 204 opposite the upper surface 222 and/or the lower surface 224. The first bottom-side metallization 240 and the second bottom-side metallization 242 may be located in a plane generally parallel to the x-axis or a plane generally parallel to the upper surface 222. In aspects, the x-axis may be a horizontal axis. In one aspect, the first bottom-side metallization 240 and/or the second bottom-side metallization 242 may be continuous. In one aspect, the first bottom-side metallization 240 and/or the second bottom-side metallization 242 may be discontinuous or segmented. The first bottom-side metallization 240 and the second bottom-side metallization 242 may comprise a metallic material such as copper, gold, nickel, palladium, silver, tin, a gold tin alloy, and the like, and combinations thereof. In one aspect, the first bottom-side metallization 240 may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

The vias 228 may be metallic plated holes or metallic filled holes that may function as electrical tunnels through the substrate 204. The vias 228 may comprise a metallic material such as copper, gold, nickel, palladium, silver, tin, a gold tin alloy, and the like, and combinations thereof. The vias 228 may have an axis that may be located in a plane generally perpendicular to the x-axis, a plane generally parallel to the y-axis, and/or a plane generally perpendicular to the upper surface 222.

Figure 3:
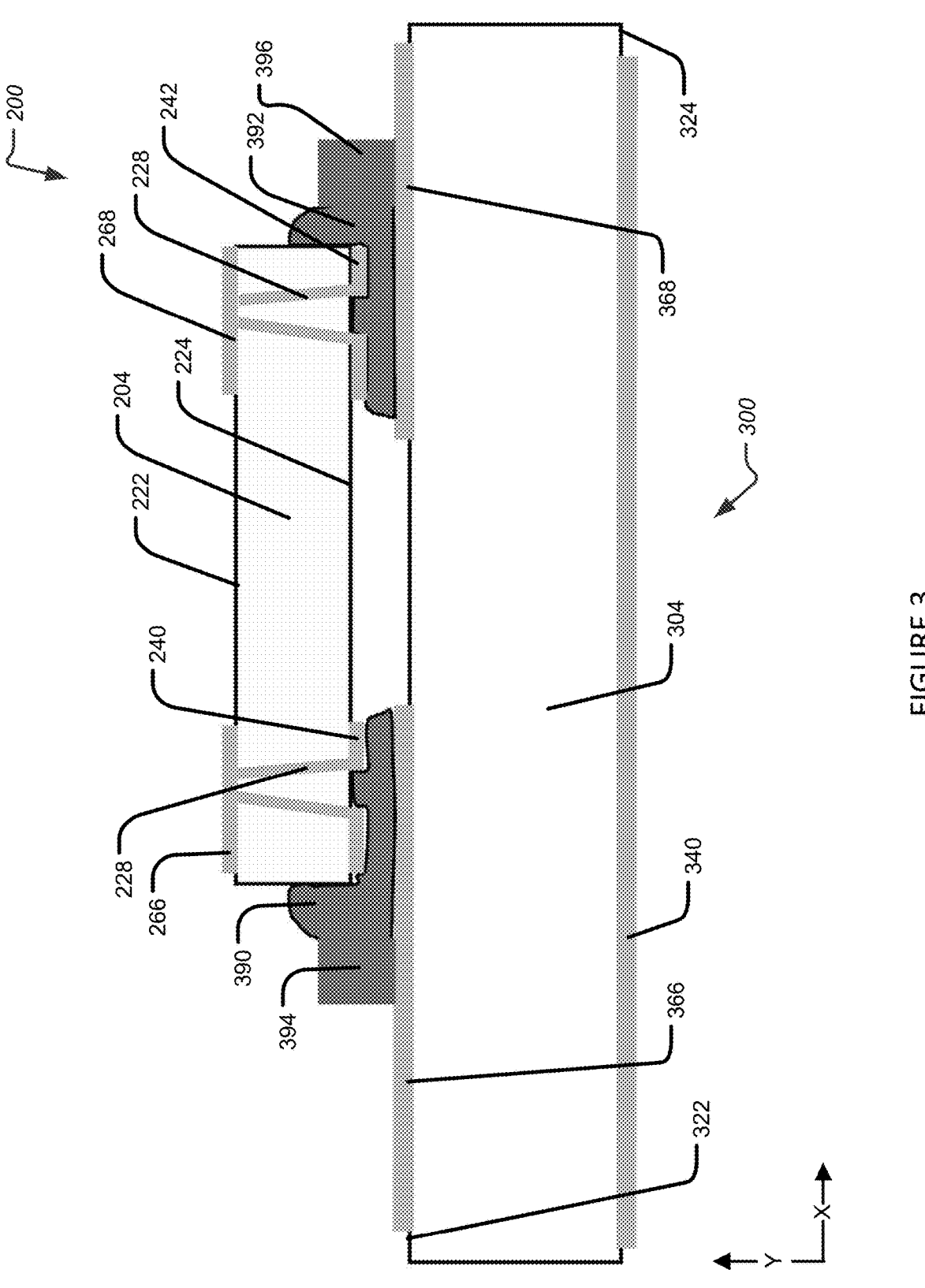
FIG. 3 illustrates a cross-sectional side view of a device implementing a SiC SMD component according to the disclosure.

FIG. 3 illustrates a cross-sectional side view of a device implementing a SiC SMD component according to the disclosure.

Figure 4:
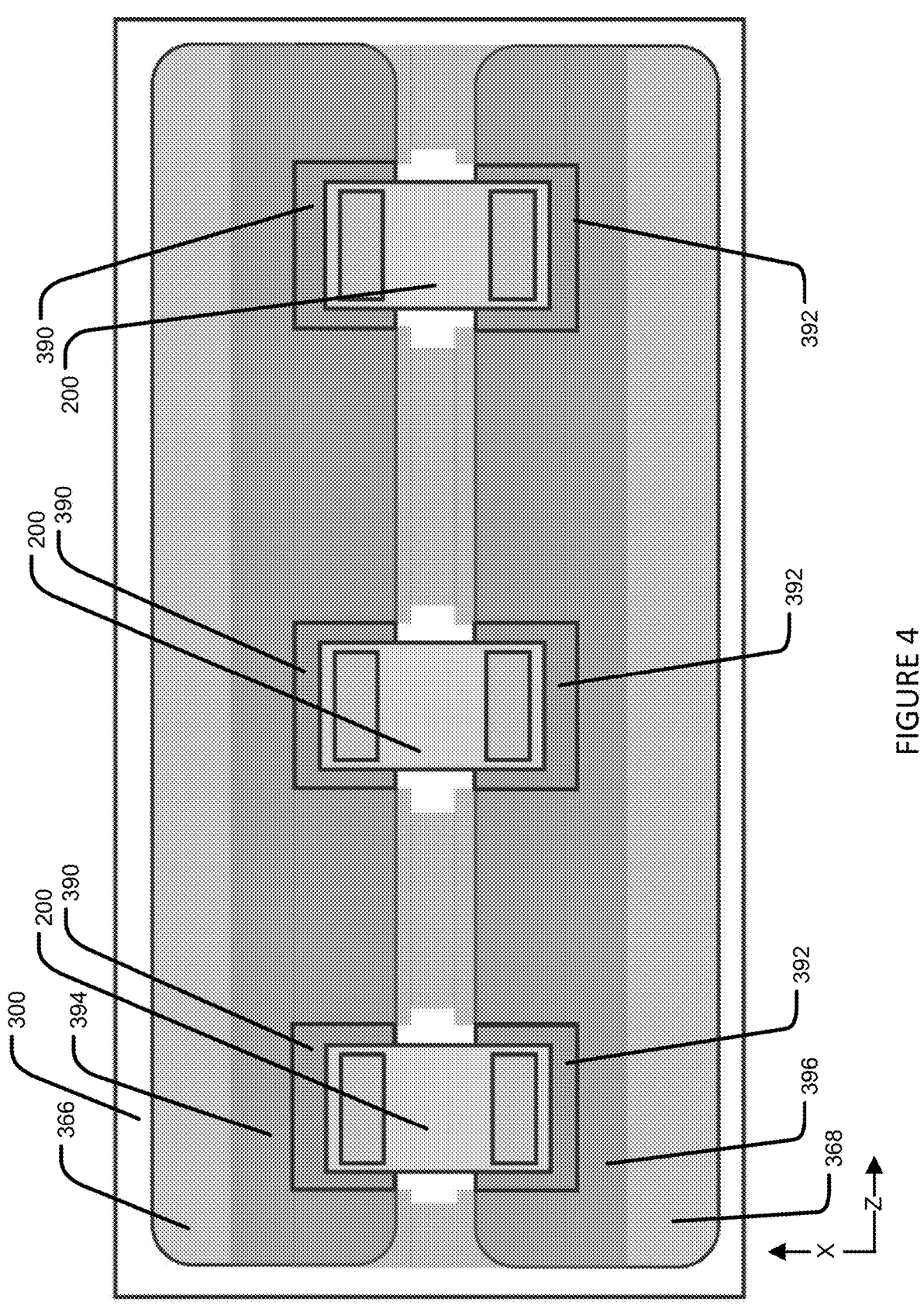
FIG. 4 illustrates a top view of the device implementing the SiC SMD according to FIG. 3.

FIG. 4 illustrates a top view of the device implementing the SiC SMD according to FIG. 3.

Figure 5:
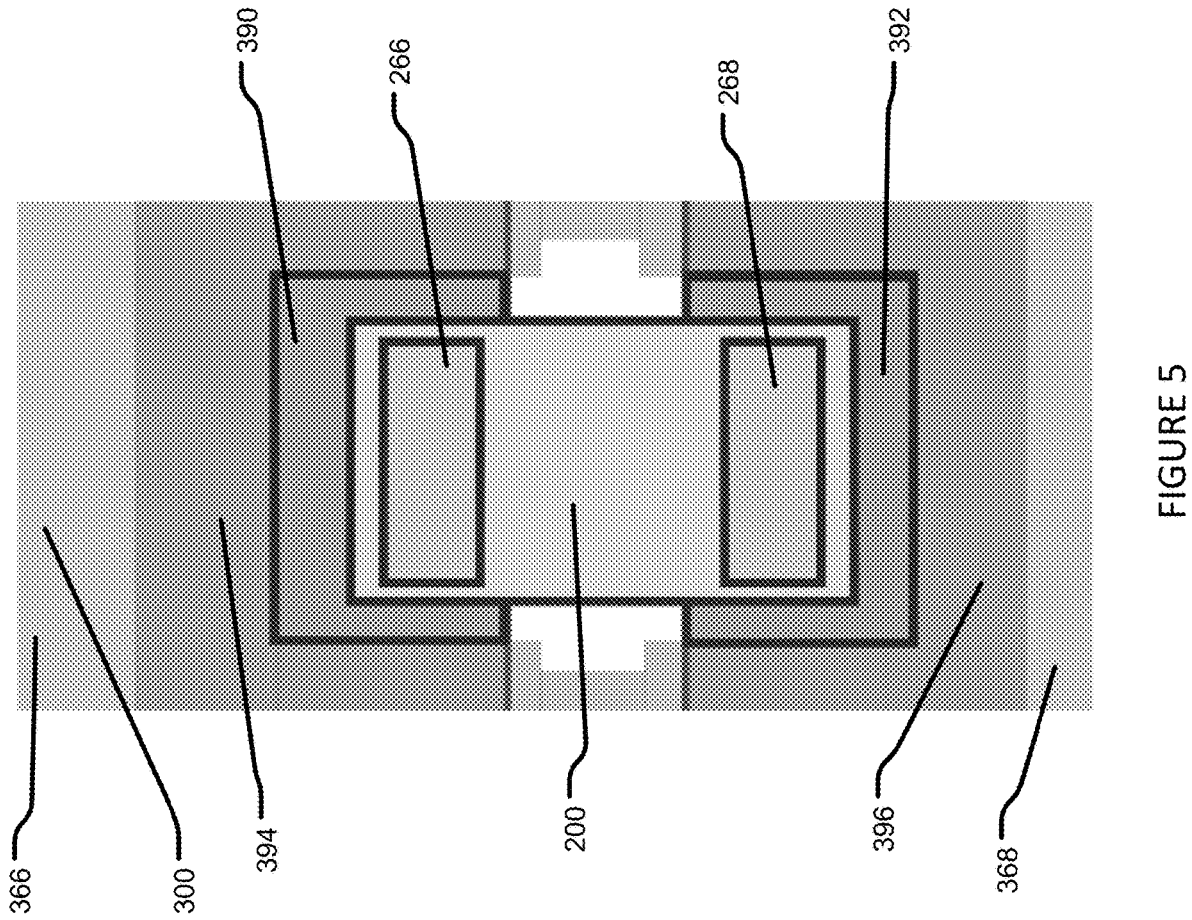
FIG. 5 illustrates a more detailed top view of the device implementing the SiC SMD according to FIG. 3.
Figure 5:
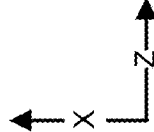

FIG. 5 illustrates a more detailed top view of the device implementing the SiC SMD according to FIG. 3.

Aspects of FIG. 3, FIG. 4, and FIG. 5 may include any one or more other features, components, arrangements, and the like as described herein. In particular, FIG. 3 illustrates a device 300 implementing the at least one SiC SMD component 200. The device 300 may include a substrate 304, a first top metal 366, a second top metal 368, a metallization layer 340, and/or the like. Further, the device 300 may include a first solder portion 390, a second solder portion 392, a first solder mask 394, and a second solder mask 396.

As illustrated in FIG. 3, the first solder mask 394 may be arranged on the device 300. In particular, the first solder mask 394 may be arranged on the upper surface 322 of the device 300. In aspects, the first solder mask 394 may be arranged on the first top metal 366 of the device 300. Further, the first solder mask 394 may be arranged adjacent the at least one SiC SMD component 200 along the x-axis. In aspects, the first solder mask 394 may be arranged adjacent the first bottom-side metallization 240 of the at least one SiC SMD component 200 along the x-axis; and the first solder mask 394 may be arranged adjacent the first top-side metallization 266 of the at least one SiC SMD component 200 along the x-axis.

As further illustrated in FIG. 3, the second solder mask 396 may be arranged on the device 300. In particular, the second solder mask 396 may be arranged on the upper surface 322 of the device 300. In aspects, the second solder mask 396 may be arranged on the second top metal 368 of the device 300. Further, the second solder mask 396 may be arranged adjacent the at least one SiC SMD component 200 along the x-axis. In aspects, the second solder mask 396 may be arranged adjacent the second bottom-side metallization 242 of the at least one SiC SMD component 200 along the x-axis; and the first solder mask 394 may be arranged adjacent the second top-side metallization 268 of the at least one SiC SMD component 200 along the x-axis.

The substrate 304 may include an upper surface 322. The upper surface 322 may support the first top metal 366 and the second top metal 368. The substrate 304 may be implemented as a printed circuit board (PCB), a printed wiring board (PWB), a printed circuit board assembly (PCBA), a medium used to connect electronic components to one another in a controlled manner, and/or the like. In aspects, the substrate 304 may be implemented as a laminated sandwich structure of one or more conductive and insulating layers. In aspects, the substrate 304 may include one or more conductive layers, traces, planes and/or the like. In aspects, the substrate 304 may be etched from one or more sheet layers of copper laminated onto and/or between sheet layers of a non-conductive substrate. In aspects, the substrate 304 may be configured such that the at least one SiC SMD component 200 and/or other electrical components may be fixed to the first top metal 366, the second top metal 368, and/or other conductive pads on outer layers of the substrate 304. In aspects, the substrate 304 may include plated-through holes that allow interconnections between layers.

The at least one SiC SMD component 200 may be attached to the substrate 304 using the first solder portion 390 and/or the second solder portion 392. The solder of the first solder portion 390 and/or the second solder portion 392 may be "walled" or "fenced" in by the first solder mask 394 and/or the second solder mask 396.

A metallization of the first bottom-side metallization 240 and/or the second bottom-side metallization 242 of the at least one SiC SMD component 200 may be patterned on the at least one SiC SMD component 200 to replicate SMD-like leads. Additionally, the metallization of the first top metal 366 and/or the second top metal 368 of the device 300 may be connected to the metallization of the first bottom-side metallization 240 and/or the second bottom-side metallization 242 of the at least one SiC SMD component 200 with the first solder portion 390 and the second solder portion 392.

In aspects, the metallization of the first top metal 366 of the device 300 may be connected to the metallization of the first bottom-side metallization 240 with the first solder portion 390. In aspects, the metallization of the second top metal 368 of the device 300 may be connected to the metallization of the second bottom-side metallization 242 of the at least one SiC SMD component 200 with the second solder portion 392.

Further, the metallization of the first top-side metallization 266 and/or the second top-side metallization 268 of the at least one SiC SMD component 200 may be connected to the metallization of the first bottom-side metallization 240 and/or the second bottom-side metallization 242 of the at least one SiC SMD component 200 with the vias 228.

FIG. 4 illustrates a top view of a combined number of implementations of the at least one SiC SMD component 200 on the substrate 304 of the device 300. Further, FIG. 4 illustrates how the solder mask and associated solder mask openings may be used to guide a placement of solder including the first solder portion 390 and the second solder portion 392, and contain the reflowed solder, so that the at least one SiC SMD component 200 can self-align to a more exact intended placement position on the substrate 304 of the device 300.

With reference to FIG. 3, the first top metal 366 and the second top metal 368 may be arranged on the upper surface 322 of the substrate 304. In particular, there may be one or more intervening layers or structures between the upper surface 322 of the substrate 304 and the first top metal 366 (not shown); and there may be one or more intervening layers or structures between the upper surface 322 of the substrate 304 and the second top metal 368 (not shown). In other aspects, the first top metal 366 may be directly arranged on the upper surface 322 of the substrate 304. In other aspects, the second top metal 368 may be directly arranged on the upper surface 322 of the substrate 304. In one aspect, the first top metal 366 and/or the second top metal 368 may be continuous. In one aspect, the first top metal 366 and/or the second top metal 368 may be discontinuous or segmented.

The substrate 304 may include a lower surface 324. The device 300 may include the metallization layer 340 located on a lower surface 324 of the substrate 304 opposite the upper surface 322 and/or the lower surface 324. The metallization layer 340 may be located in a plane generally parallel to the x-axis or a plane generally parallel to the upper surface 322. In one aspect, the metallization layer 340 may be continuous. In one aspect, the metallization layer 340 may be discontinuous or segmented. The metallization layer 340 may comprise a metallic material such as copper, gold, nickel, palladium, silver, tin, a gold tin alloy, and the like, and combinations thereof. In one aspect, the metallization layer 340 may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

In aspects, the substrate 304 may be implemented as a PCB having a single-sided construction with one copper layer. In aspects, the substrate 304 may be implemented as a PCB having a double-sided construction having two copper layers on both sides of one substrate layer. In aspects, the substrate 304 may be implemented as a PCB having a multi-layer construction having outer and inner layers of copper, alternating with layers of a substrate. In aspects, the substrate 304 may be implemented with a surface having a coating that protects the copper from corrosion and reduces the chances of solder shorts between traces or undesired electrical contact with stray bare wires. In aspects, the substrate 304 may be implemented with a FR-4 glass epoxy, a cotton paper impregnated with phenolic resin, and/or the like. In aspects, the substrate 304 may be implemented with FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester).

As illustrated in FIG. 5, the first solder mask 394 may be arranged on the first top metal 366 of the device 300 adjacent the at least one SiC SMD component 200 along the x-axis and the z-axis. In aspects, the first solder mask 394 may be arranged adjacent the first top-side metallization 266 of the at least one SiC SMD component 200 along the x-axis and the z-axis. In particular aspects, the first solder mask 394 may be arranged adjacent the first top-side metallization 266 of the at least one SiC SMD component 200 with a first portion along the x-axis, the first solder mask 394 may be arranged adjacent the first top-side metallization 266 of the at least one SiC SMD component 200 with a second portion along z-axis, and the first solder mask 394 may be arranged adjacent the first top-side metallization 266 of the at least one SiC SMD component 200 with a third portion along the x-axis.

In aspects, the first portion of the first solder mask 394 may connect to the second portion of the first solder mask 394; and the second portion of the first solder mask 394 may connect to the third portion of the first solder mask 394. In aspects, the first portion of the first solder mask 394, the second portion of the first solder mask 394, and the third portion of the first solder mask 394 may form a U-shape on the first top metal 366 partially surrounding the first top-side metallization 266 of the at least one SiC SMD component 200. In aspects, the first portion of the first solder mask 394, the second portion of the first solder mask 394, and the third portion of the first solder mask 394 may form a U-shape on the first top metal 366 partially surrounding three sides of the at least one SiC SMD component 200.

As further illustrated in FIG. 5, the first solder portion 390 may be arranged on the first top metal 366 of the device 300 adjacent the at least one SiC SMD component 200 along the x-axis and the z-axis. In aspects, the first solder portion 390 may be arranged adjacent the first top-side metallization 266 of the at least one SiC SMD component 200 along the x-axis and the z-axis. In particular aspects, the first solder portion 390 may be arranged adjacent the first top-side metallization 266 of the at least one SiC SMD component 200 with a first portion along the x-axis, the first solder portion 390 may be arranged adjacent the first top-side metallization 266 of the at least one SiC SMD component 200 with a second portion along z-axis, and the first solder portion 390 may be arranged adjacent the first top-side metallization 266 of the at least one SiC SMD component 200 with a third portion along the x-axis.

In aspects, the first portion of the first solder portion 390 may connect to the second portion of the first solder portion 390; and the second portion of the first solder portion 390 may connect to the third portion of the first solder portion 390. In aspects, the first portion of the first solder portion 390, the second portion of the first solder portion 390, and the third portion of the first solder portion 390 may form a U-shape on the first top metal 366 partially surrounding the first top-side metallization 266 of the at least one SiC SMD component 200. In aspects, the first portion of the first solder portion 390, the second portion of the first solder portion 390, and the third portion of the first solder portion 390 may form a U-shape on the first top metal 366 partially surrounding three sides of the at least one SiC SMD component 200.

As further illustrated in FIG. 5, the second solder mask 396 may be arranged on the second top metal 368 of the device 300 adjacent the at least one SiC SMD component 200 along the x-axis and the z-axis. In aspects, the second solder mask 396 may be arranged adjacent the second top-side metallization 268 of the at least one SiC SMD component 200 along the x-axis and the z-axis. In particular aspects, the second solder mask 396 may be arranged adjacent the second top-side metallization 268 of the at least one SiC SMD component 200 with a first portion along the x-axis, the second solder mask 396 may be arranged adjacent the second top-side metallization 268 of the at least one SiC SMD component 200 with a second portion along z-axis, and the second solder mask 396 may be arranged adjacent the second top-side metallization 268 of the at least one SiC SMD component 200 with a third portion along the x-axis.

In aspects, the first portion of the second solder mask 396 may connect to the second portion of the second solder mask

396; and the second portion of the second solder mask 396 may connect to the third portion of the second solder mask 396. In aspects, the first portion of the second solder mask 396, the second portion of the second solder mask 396, and the third portion of the second solder mask 396 may form a U-shape on the second top metal 368 partially surrounding the second top-side metallization 268 of the at least one SiC SMD component 200. In aspects, the first portion of the second solder mask 396, the second portion of the second solder mask 396, and the third portion of the second solder mask 396 may form a U-shape on the second top metal 368 partially surrounding three sides of the at least one SiC SMD component 200.

As further illustrated in FIG. 5, the second solder portion 392 may be arranged on the first top metal 366 of the device 300 adjacent the at least one SiC SMD component 200 along the x-axis and the z-axis. In aspects, the second solder portion 392 may be arranged adjacent the second top-side metallization 268 of the at least one SiC SMD component 200 along the x-axis and the z-axis. In particular aspects, the second solder portion 392 may be arranged adjacent the second top-side metallization 268 of the at least one SiC SMD component 200 with a first portion along the x-axis, the second solder portion 392 may be arranged adjacent the second top-side metallization 268 of the at least one SiC SMD component 200 with a second portion along z-axis, and the second solder portion 392 may be arranged adjacent the second top-side metallization 268 of the at least one SiC SMD component 200 with a third portion along the x-axis.

In aspects, the first portion of the second solder portion 392 may connect to the second portion of the second solder portion 392; and the second portion of the second solder portion 392 may connect to the third portion of the second solder portion 392. In aspects, the first portion of the second solder portion 392, the second portion of the second solder portion 392, and the third portion of the second solder portion 392 may form a U-shape on the first top metal 366 partially surrounding the second top-side metallization 268 of the at least one SiC SMD component 200. In aspects, the first portion of the second solder portion 392, the second portion of the second solder portion 392, and the third portion of the second solder portion 392 may form a U-shape on the first top metal 366 partially surrounding three sides of the at least one SiC SMD component 200.

The first solder mask 394, the second solder mask 396, the first solder portion 390, and the second solder portion 392 may be configured and/or arranged on the device 300 such that the at least one SiC SMD component 200 aligns and centers itself on the device 300 after solder reflow of the first solder portion 390 and the second solder portion 392. The solder of the first solder portion 390 and the second solder portion 392 may also be arranged and configured such that solder also flows away from any metal openings and gaps of the device 300. In particular, the solder of the first solder portion 390 and the second solder portion 392 may also be arranged and configured such that solder also flows away from any metal openings and gaps between the first top metal 366 and the second top metal 368 of the device 300.

Figure 6:
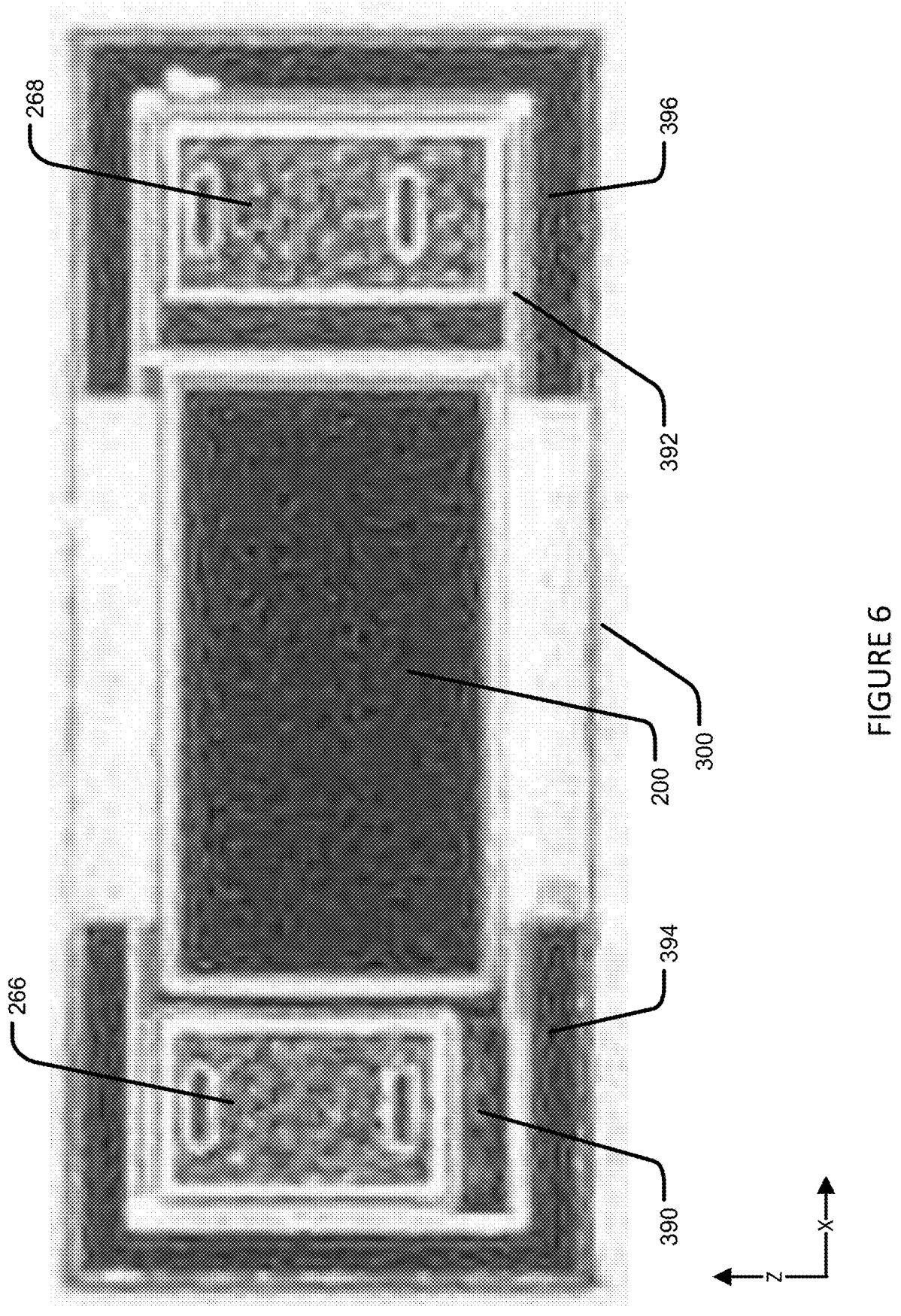
FIG. 6 is a photograph of a top side view of the at least one SiC SMD component according to aspects of the disclosure.

FIG. 6 is a photograph of a top side view of the at least one SiC SMD component according to aspects of the disclosure.

Figure 7:
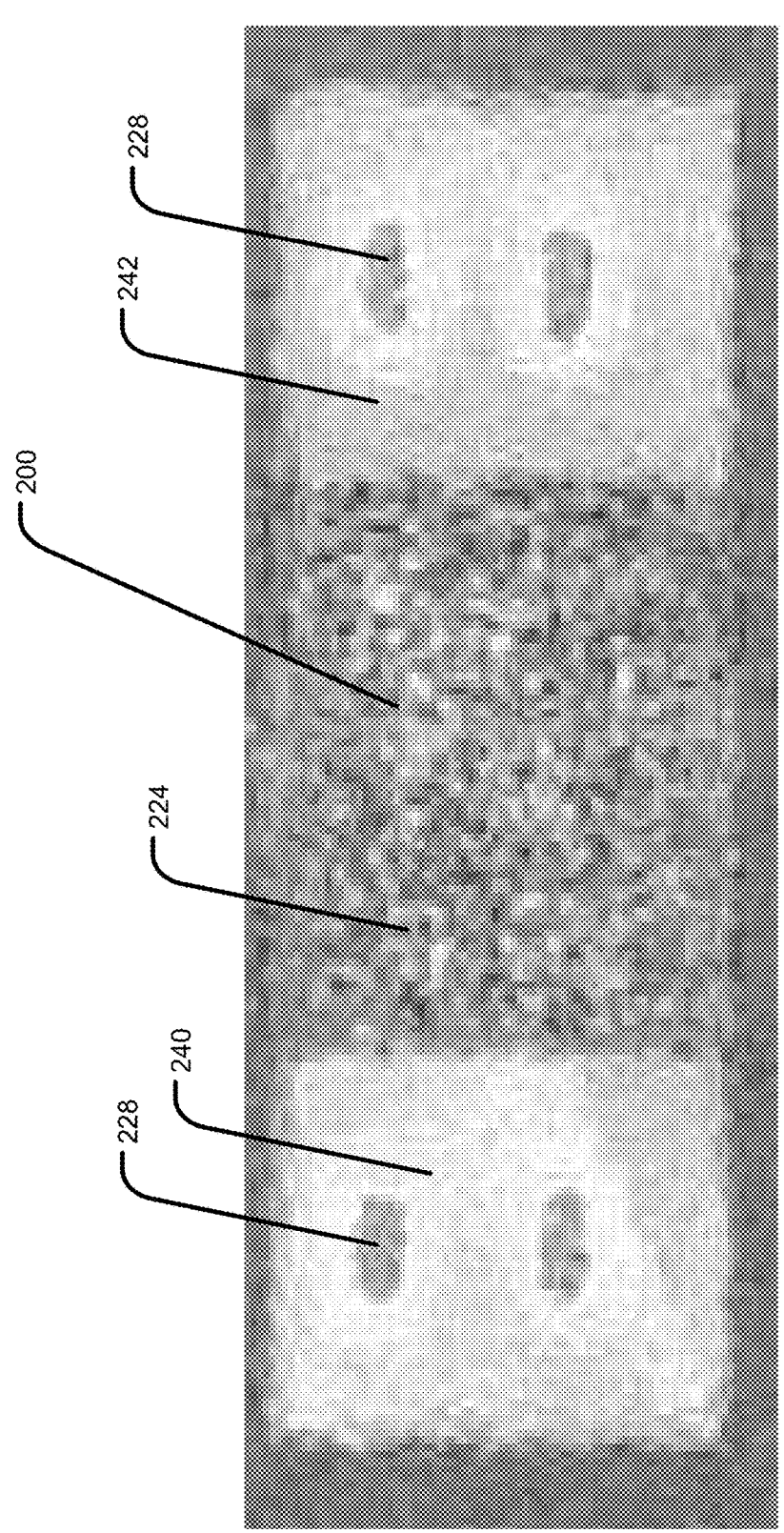
FIG. 7 is a photograph of a bottom side view of the at least one SiC SMD component according to FIG. 6.

FIG. 7 is a photograph of a bottom side view of the at least one SiC SMD component according to FIG. 6.

Aspects of FIG. 6 and FIG. 7 may include any one or more other features, components, arrangements, and the like as described herein. In particular, FIG. 6 is a photograph of a top side view of the at least one SiC SMD component 200;

and FIG. 7 is a photograph of a bottom side view of the at least one SiC SMD component 200. As illustrated in FIG. 6 the at least one SiC SMD component 200 is shown with the first top-side metallization 266 and the second top-side metallization 268 of the at least one SiC SMD component 200; and as illustrated in FIG. 7 bottom SMD-like leads implemented by the first bottom-side metallization 240 and the second bottom-side metallization 242 of the at least one SiC SMD component 200.

Figure 8:
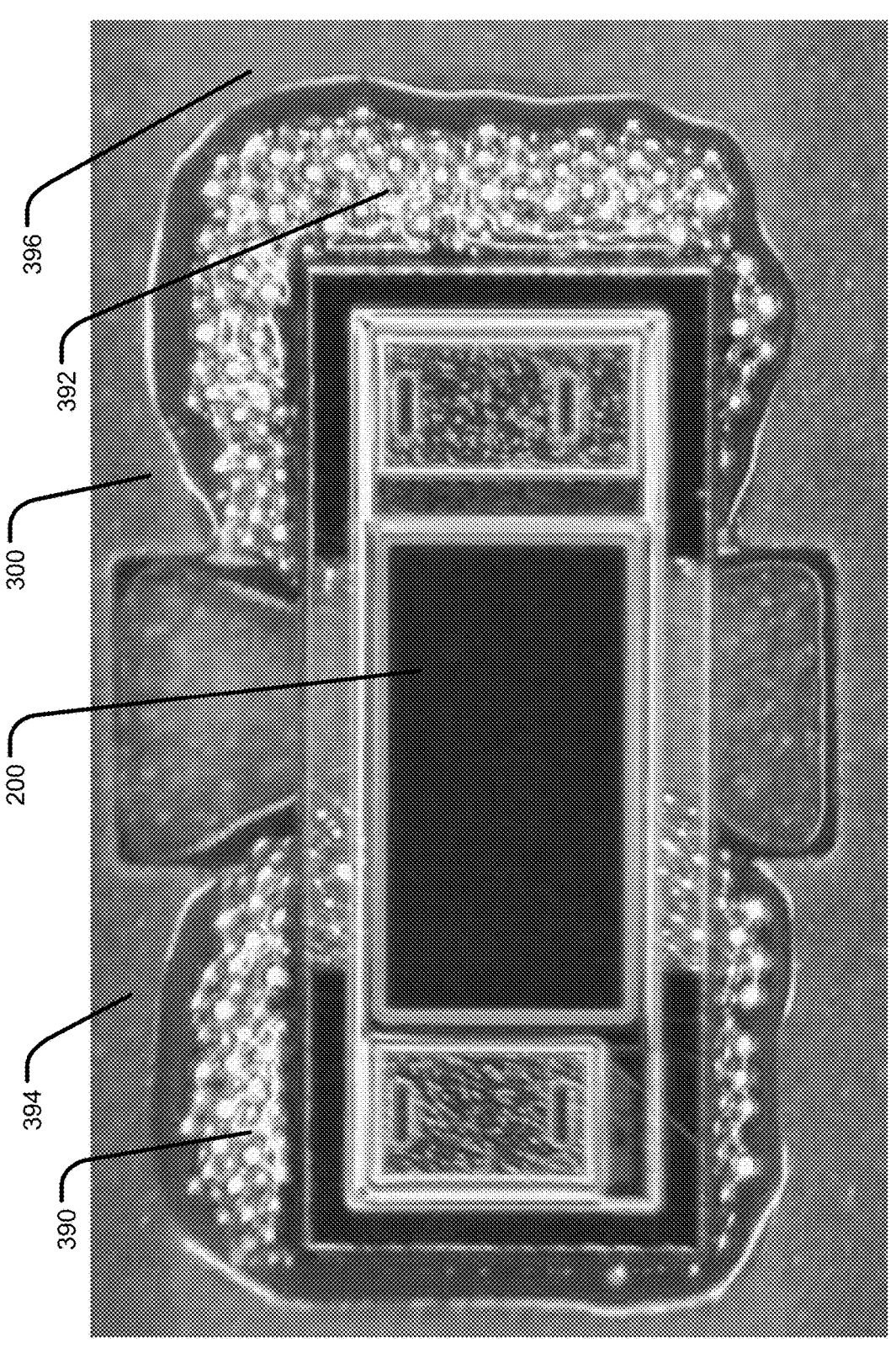
FIG. 8 is a photograph of a top side view of at least one SiC SMD component and a device prior to solder reflow according to aspects of the disclosure.

FIG. 8 is a photograph of a top side view of at least one SiC SMD component and a device prior to solder reflow according to aspects of the disclosure.

Figure 9:
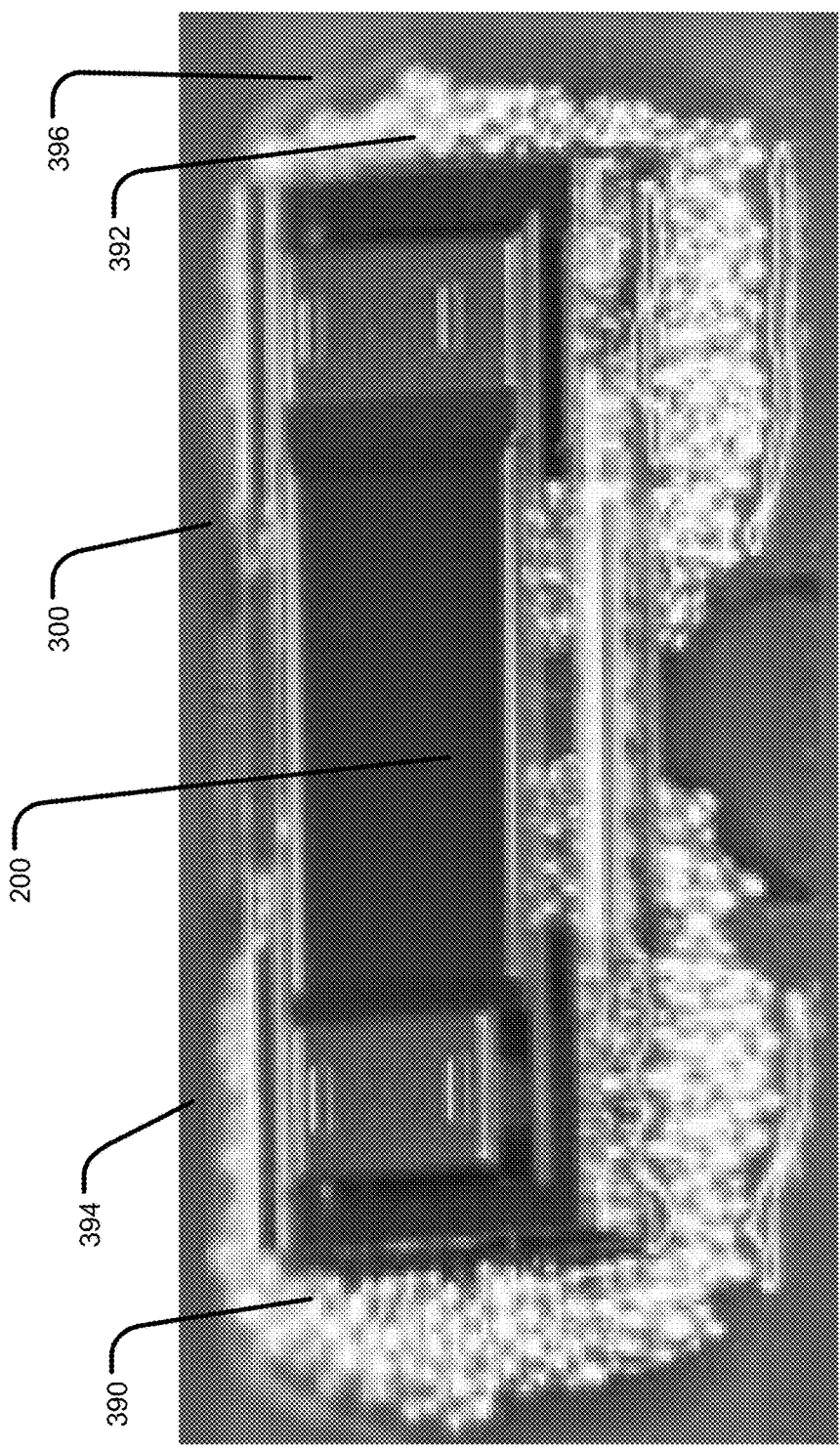
FIG. 9 is a photograph of a top perspective side view of the at least one SiC SMD component and the device prior to solder reflow according to FIG. 8.

FIG. 9 is a photograph of a top perspective side view of the at least one SiC SMD component and the device prior to solder reflow according to FIG. 8.

Aspects of FIG. 8 and FIG. 9 may include any one or more other features, components, arrangements, and the like as described herein. In particular, FIG. 8 is a photograph of a top side view of the at least one SiC SMD component 200 and the device 300 prior to solder reflow; and FIG. 9 is a photograph of a top perspective side view of the at least one SiC SMD component 200 and the device 300 prior to solder reflow. More specifically, FIG. 8 and FIG. 9 illustrates the at least one SiC SMD component 200 after component place-ment on the device 300 prior to solder reflow.

Figure 10:
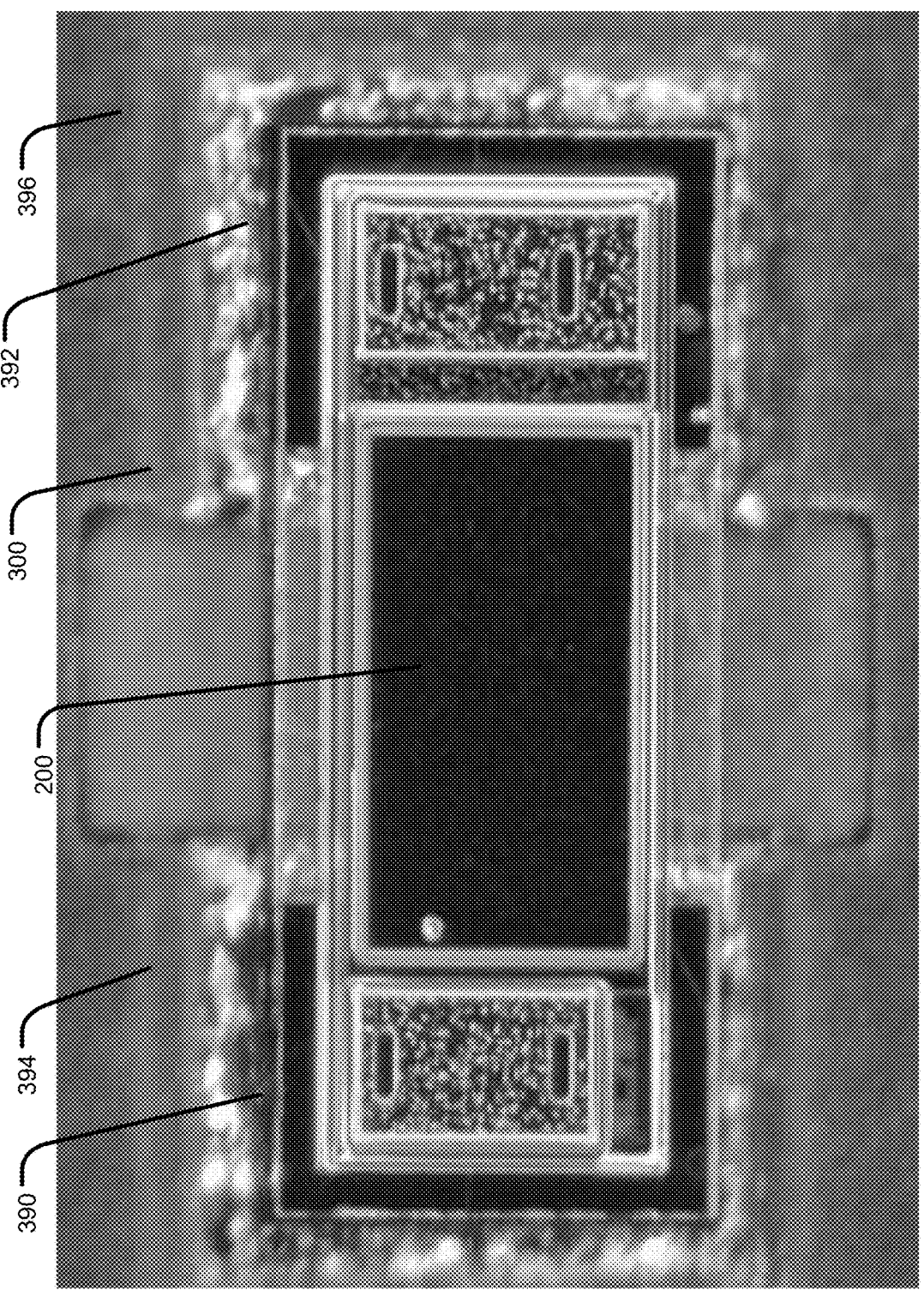
FIG. 10 is a photograph of a top side view of the at least one SiC SMD component and the device after solder reflow according to aspects of the disclosure.

FIG. 10 is a photograph of a top side view of the at least one SiC SMD component and the device after solder reflow according to aspects of the disclosure.

Figure 11:
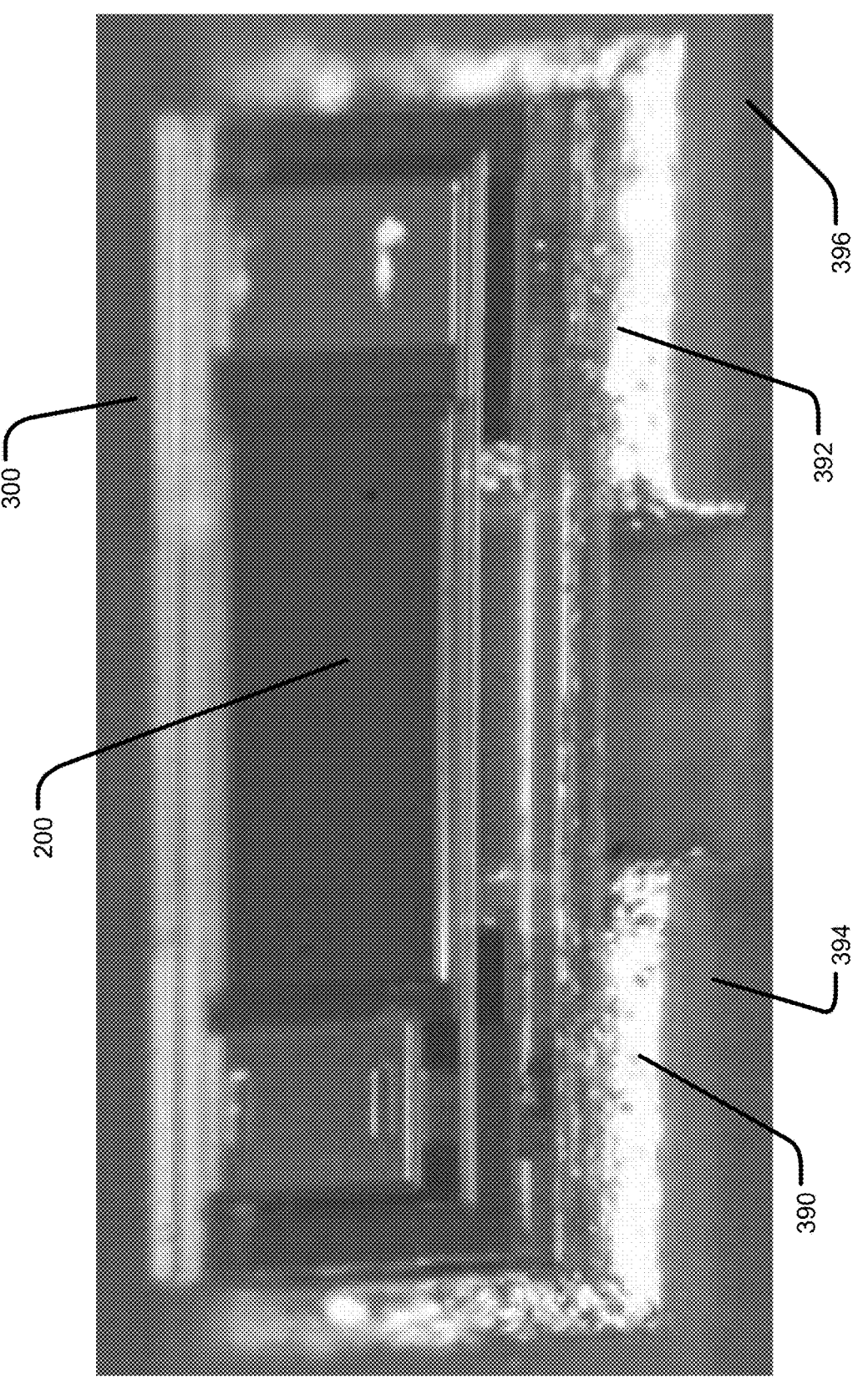
FIG. 11 is a photograph of a top perspective side view of the at least one SiC SMD component and the device after solder reflow according to FIG. 10.

FIG. 11 is a photograph of a top perspective side view of the at least one SiC SMD component and the device after solder reflow according to FIG. 10.

FIG. 10 and FIG. 11 may include any one or more other features, components, arrangements, and the like as described herein. In particular, FIG. 10 is a photograph of a top side view of the at least one SiC SMD component 200 and the device 300 after solder reflow; and FIG. 11 is a photograph of a top perspective side view of the at least one SiC SMD component 200 and the device 300 after solder reflow. More specifically, FIG. 10 and FIG. 11 illustrates the at least one SiC SMD component 200 after component placement on the device 300 after solder reflow. As illustrated in FIG. 10 and FIG. 11, the at least one SiC SMD component 200 aligns and centers itself on the device 300 after solder reflow. The solder also flows away from any metal openings and gaps of the device 300.

FIG. 12 illustrates a cross-sectional side view of a SiC SMD component according to the disclosure.

Figure 13:
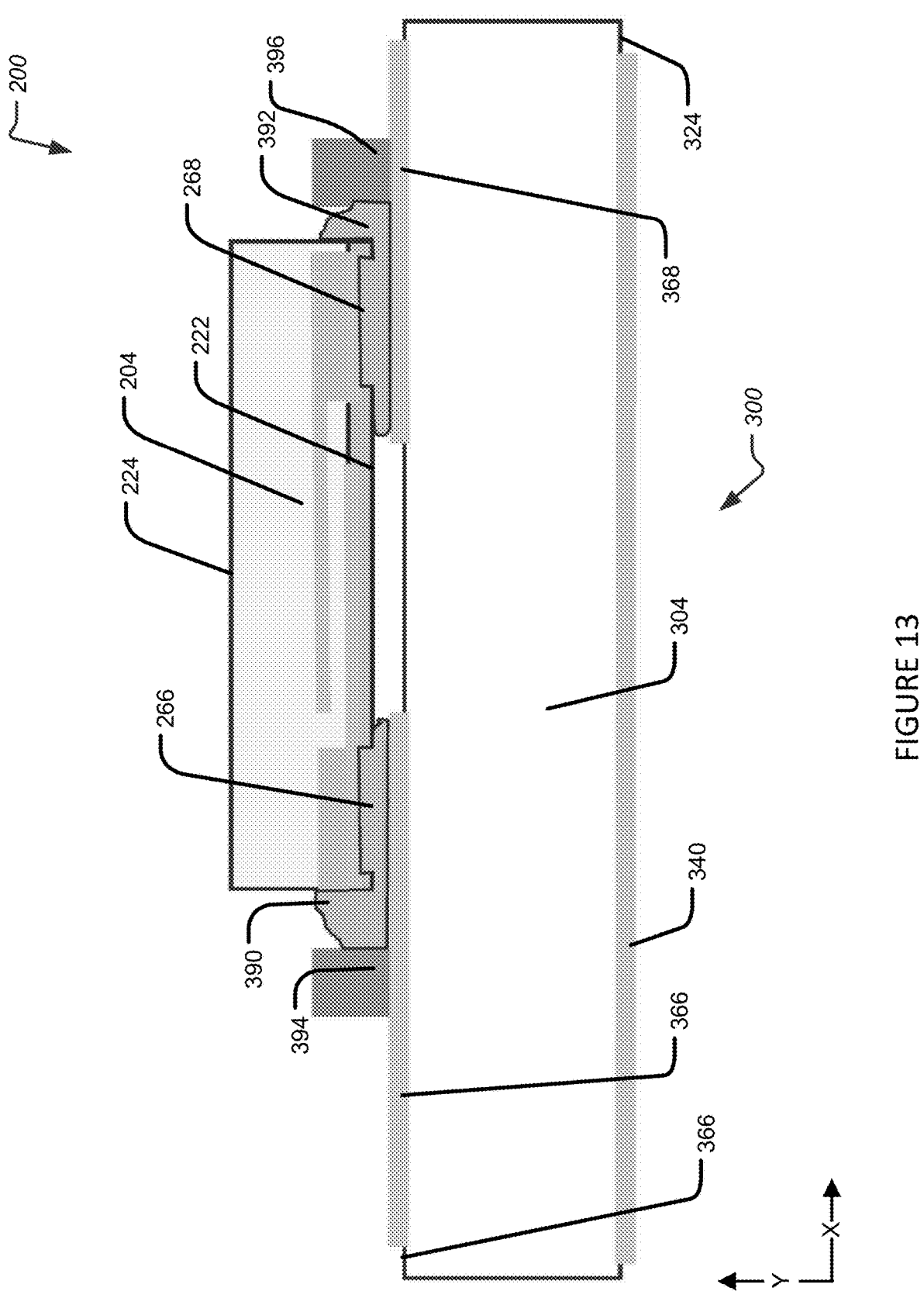
FIG. 13 illustrates a cross-sectional side view of a device implementing the SiC SMD component according to FIG. 12.

FIG. 13 illustrates a cross-sectional side view of a device implementing the SiC SMD component according to FIG. 12.

Aspects of FIG. 12 and FIG. 13 may include any one or more other features, components, arrangements, and the like as described herein. In particular, FIG. 12 illustrates another implementation of the at least one SiC SMD component 200. In the FIG. 12 aspect of the at least one SiC SMD component 200, the at least one SiC SMD component 200 may be implemented without back-side metallization or vias. More specifically, in the FIG. 12 aspect of the at least one SiC SMD component 200, the at least one SiC SMD component 200 is implemented without the first bottom-side metalliza-tion 240, the second bottom-side metallization 242, and the vias 228. Further, the aspect of the at least one SiC SMD component 200 illustrated in FIG. 12 is shown prior to being flipped. In this regard, patterned top SMD-like leads may be implemented by the first top-side metallization 266 and the second top-side metallization 268. Thereafter, the aspect of the at least one SiC SMD component 200 illustrated in FIG. 12 may be flipped and attached to the device 300 as illustrated in FIG. 13.

With further reference to FIG. 12, the at least one SiC SMD component 200 may be implemented with a structure configured to implement the circuit 290. The FIG. 12 aspect of the at least one SiC SMD component 200 may be flipped upside down as illustrated in FIG. 13, such that the top pads, that may include the first top-side metallization 266 and the second top-side metallization 268, form leads for making contact to PCB solder pads, such as the first top metal 366 and the second top metal 368 of the device 300. In aspects, the FIG. 12 aspect of the at least one SiC SMD component 200 may have lower complexity, lower cost, and/or the like due to the removal of the back-side metallization, such as the first bottom-side metallization 240 and the second bottom-side metallization 242 illustrated in FIG. 1, and via process-ing associated with the vias 228 illustrated in FIG. 1. The first top-side metallization 266 and/or the second top-side metallization 268 of the at least one SiC SMD component 200 may be patterned on the at least one SiC SMD com-ponent 200 to replicate SMD-like leads. In this regard, a structure, an arrangement, a location, a shape, and/or the like of the first top-side metallization 266 and/or the second top-side metallization 268 replicate SMD-like leads. Accordingly, the at least one SiC SMD component 200 may be configured to be implemented in place of standard SMD type components.

In particular aspects, the at least one SiC SMD component 200 may be configured to implement the circuit 290 to form a Metal-Insulator-Metal (MIM) capacitor with a first metal 264 and a second metal 274 having a dielectric layer 262 therebetween. The first metal 264 may be continuous or segmented, the dielectric layer 262 may be continuous or segmented, and the second metal 274 may be continuous or segmented. The Metal-Insulator-Metal (MIM) capacitor may be defined by the area of the first metal 264 and/or the second metal 274 and the thickness and dielectric constant of the dielectric layer 262.

The first metal 264 may be arranged parallel to the x-axis as illustrated, the first metal 264 may be continuous and arranged parallel the first top-side metallization 266 and the second top-side metallization 268. Moreover, the first metal 264 may be arranged vertically above the second metal 274 along the y-axis as illustrated prior to being flipped. Further, the first metal 264 may be arranged vertically below the second metal 274 along the y-axis after being flipped.

The second metal 274 may be formed as a metal surface on the upper surface 222 of the substrate 204 and may comprise a metallic material such as copper, gold, nickel, palladium, silver, tin, a gold tin alloy, and the like, and combinations thereof. In one aspect, the first metal 264 and the second metal 274 may have a thickness along the y-axis of 0.1 microns to 0.6 microns, 0.1 microns to 0.2 microns, 0.2 microns to 0.3 microns, 0.3 microns to 0.4 microns, 0.4 microns to 0.5 microns, or 0.5 microns to 0.6 microns.

The dielectric layer 262 may be arranged on the second metal 274. In particular, there may be one or more inter-vening layers or structures between the dielectric layer 262 and the second metal 274 (not shown). In other aspects, the dielectric layer 262 may be directly arranged on the second metal 274. In one aspect, the dielectric layer 262 may be continuous. The dielectric layer 262 may include SiN, AlO, SiO, $SiO_2$, AlN, or the like or combinations thereof together with other intervening layers. The dielectric layer 262 may have any thickness along a y-axis to provide the desired capacitance density, capacitance, standoff voltage, and/or the like. In some aspects, the dielectric layer 262 may have a thickness along the y-axis of 100 Å to 11000 Å, 100 Å to 1000 Å, 1000 Å to 2000 Å, 2000 Å to 3000 Å, 3000 Å to 4000 Å, 4000 Å to 5000 Å, 5000 Å to 6000 Å, 6000 Å to 7000 Å, 7000 Å to 8000 Å, 8000 Å to 9000 Å, 9000 Å to 10000 Å, or 10000 Å to 11000 Å. In some aspects, the dielectric layer 262 may have a thickness along the y-axis of greater than 10000 Å.

The first metal 264 may be arranged on the dielectric layer 262. In particular, there may be one or more intervening layers or structures between the first metal 264 and the dielectric layer 262 (not shown). In other aspects, the first metal 264 may be directly arranged on the dielectric layer 262. The first metal 264 may be formed as a metal surface on an upper surface the dielectric layer 262 and may comprise a metallic material such as copper, gold, nickel, palladium, silver, tin, a gold tin alloy, and the like, and combinations thereof. In some aspects, the first metal 264 may comprise stacked layers. In one aspect, the first metal 264 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

Figure 14:
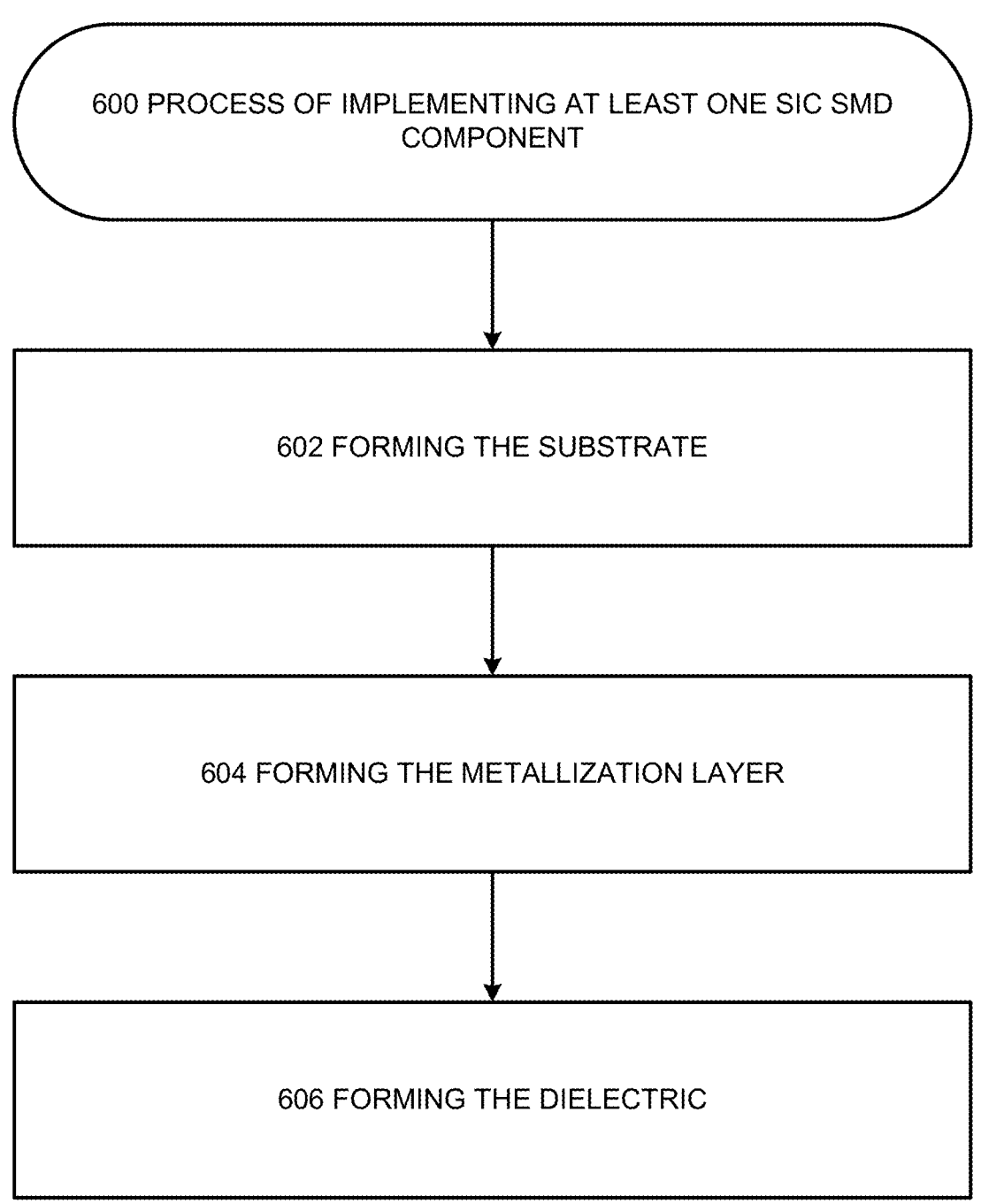
FIG. 14 shows a process of implementing at least one SiC SMD component according to the disclosure.

FIG. 14 shows a process of implementing at least one SiC SMD component according to the disclosure.

FIG. 14 may include any one or more other features, components, arrangements, and the like as described herein. In particular, FIG. 14 illustrates a process of implementing at least one SiC SMD component 600 that relates to the at least one SiC SMD component 200 as described herein. It should be noted that the aspects of the process of implementing at least one SiC SMD component 600 may be performed in a different order consistent with the aspects described herein. Moreover, the process of implementing at least one SiC SMD component 600 may be modified to have more or fewer processes consistent with the various aspects disclosed herein.

The process of implementing at least one SiC SMD component 600 may include a process of forming the substrate 602. More specifically, the process of forming the substrate 602 may include forming the substrate 204. The substrate 204 may be constructed, configured, and/or arranged as described herein. Additionally, the process of forming the substrate 602 may include forming electrical connections such as the vias 228 in the substrate 204.

Further, the process of implementing at least one SiC SMD component 600 may include forming the metallization layer 604. More specifically, the forming the metallization layer 604 may include forming the first bottom-side metallization 240, the second bottom-side metallization 242, the first top-side metallization 266, the second top-side metallization 268, the first metal 264, the second metal 274, and/or the like. In aspects, the first bottom-side metallization 240, the second bottom-side metallization 242, the first top-side metallization 266, the second top-side metallization 268, the first metal 264, the second metal 274, and/or the like may be constructed, configured, and/or arranged as described herein.

The process of forming the metallization layer 604 may include utilizing one or more manufacturing techniques including print screening, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes. The process of forming the metallization layer 604 may include utilizing one or more MMIC manufacturing processes and/or techniques including sputtering, electroplating with photolithography for pattern definition, and/or like processes.

In one or more aspects, the first bottom-side metallization 240, the second bottom-side metallization 242, the first top-side metallization 266, the second top-side metallization 268, the first metal 264, the second metal 274, and/or the like may be formed in select regions on the substrate 204. In further aspects, the first bottom-side metallization 240, the second bottom-side metallization 242, the first top-side metallization 266, the second top-side metallization 268, the first metal 264, the second metal 274, and/or the like may be arranged over the entire surface of the substrate 204 and selectively etched and/or otherwise removed from select locations on the substrate 204.

Additionally, the process of implementing at least one SiC SMD component 600 may include forming the dielectric 606. In one or more aspects, forming the dielectric 606 may include forming the dielectric layer 262. In aspects, the dielectric layer 262 may be formed in select regions on an upper surface of the substrate 204. In further aspects, the dielectric layer 262 may be arranged over the entire surface of the substrate 204 and selectively etched and/or otherwise removed from select locations on the upper surface of the substrate 204. In aspects, the process of forming the metallization layer 604 and the forming the dielectric 606 may be repeated in order to provide the desired construction of the dielectric layer 262, the first bottom-side metallization 240, the second bottom-side metallization 242, the first top-side metallization 266, the second top-side metallization 268, the first metal 264, the second metal 274, and/or the like.

In some aspects, the process of implementing at least one SiC SMD component 600 may include manufacturing to form the at least one SiC SMD component 200 in a wafer, a panel, and/or the like. The process of implementing the process of implementing at least one SiC SMD component 600 may include cutting the wafer utilizing cutting equipment such as wafer, circuit board, or package sawing equipment to singulate the at least one SiC SMD component 200 from the wafer, which may have the advantage that the at least one SiC SMD component 200 may be arranged on dicing tape on a ring frame, which can be directly loaded to the Die Attach equipment for subsequent assembly onto the device 300. The size of the at least one SiC SMD component 200 may be optimized to what subsequent assembly equipment like SMT, Dicing and Die Attach Equipment can handle.

Figure 15:
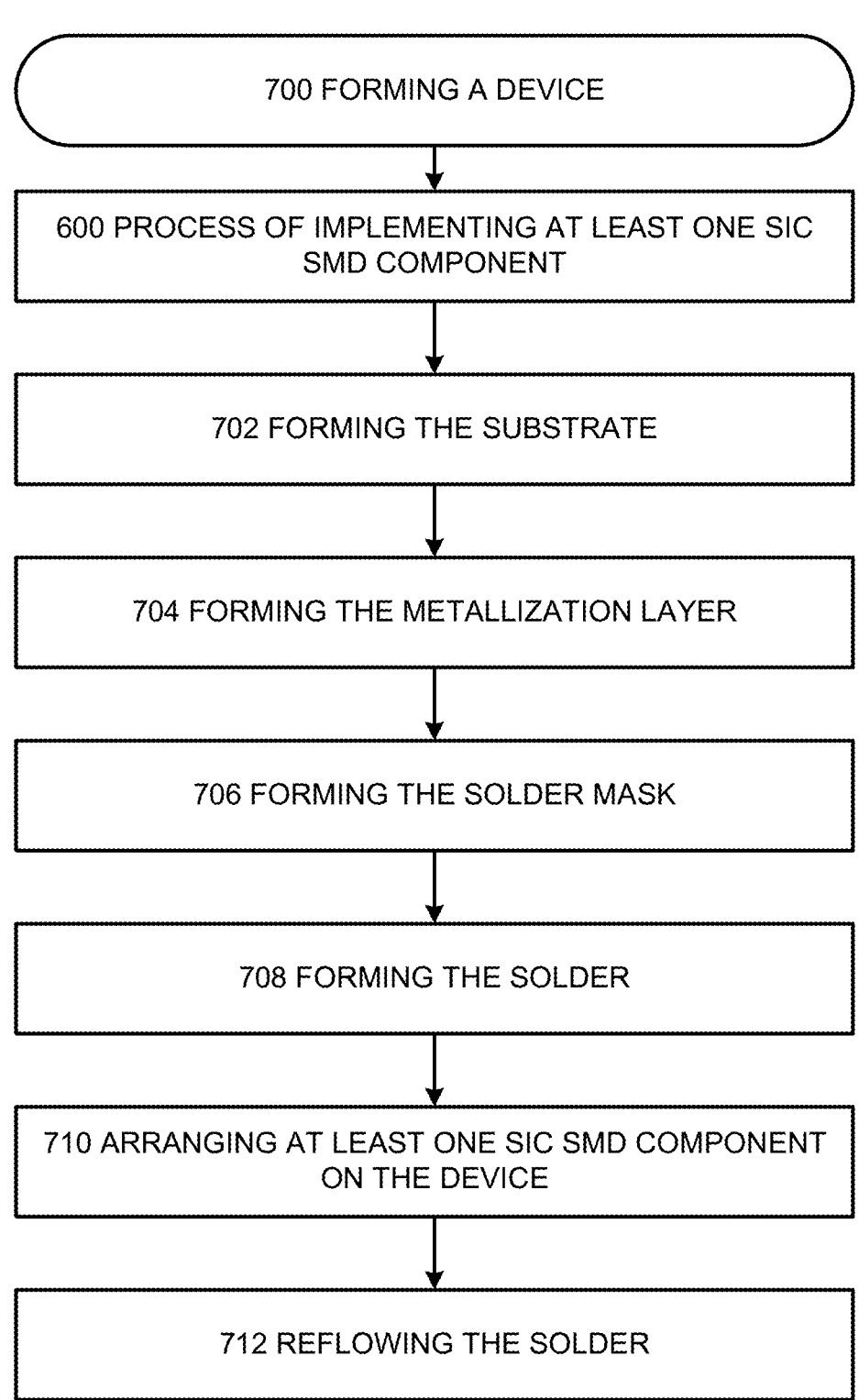
FIG. 15 shows a forming a device according to the disclosure.

FIG. 15 shows a forming a device according to the disclosure.

FIG. 15 may include any one or more other features, components, arrangements, and the like as described herein. In particular, FIG. 15 illustrates a process of forming a device 700 that relates to forming the device 300 as described herein. It should be noted that the aspects of the process of forming a device 700 may be performed in a different order consistent with the aspects described herein. Additionally, it should be noted that portions of the process of forming a device 700 may be performed in a different order consistent with the aspects described herein. Moreover, the process of forming a device 700 may be modified to have more or fewer processes consistent with the various aspects disclosed herein.

The process of forming a device 700 may include the process of implementing at least one SiC SMD component 600. More specifically, the process of implementing at least one SiC SMD component 600 may include forming the at least one SiC SMD component 200, which may be constructed, configured, and/or arranged as described herein with reference to FIG. 14 and the associated description thereof.

The process of forming a device 700 may include forming the substrate 702. More specifically, the forming the substrate 702 may include forming the substrate 304. The substrate 304 may be constructed, configured, and/or arranged as described herein.

The process of forming a device 700 may include forming the metallization layer 704. In particular aspects, the forming the metallization layer 704 may include forming the metallization layer 340 on the lower surface 324 of the substrate 304. More specifically, the metallization layer 340 may be constructed, configured, and/or arranged as described herein. In particular aspects, the forming the metallization layer 704 may include forming the first top metal 366 on the upper surface 322 of the substrate 304. More specifically, the first top metal 366 may be constructed, configured, and/or arranged as described herein.

The process of forming a device 700 may include forming the solder mask 706. In particular aspects, the forming the solder mask 706 may include forming the first solder mask 394. More specifically, the first solder mask 394 may be constructed, configured, and/or arranged as described herein. In particular aspects, the forming the solder mask 706 may include forming the second solder portion 392. More specifically, the second solder portion 392 may be constructed, configured, and/or arranged as described herein. In particular aspects, the forming the solder mask 706 may include forming the first solder mask 394 and/or the second solder portion 392 with a screen printing method, a stencil method, and/or the like onto the device 300, the first top metal 366, the upper surface 322, and/or the like.

The process of forming a device 700 may include forming the solder 708. In particular aspects, the forming the solder 708 may include forming the first solder portion 390. More specifically, the first solder portion 390 may be constructed, configured, and/or arranged as described herein. In aspects, the first solder portion 390 may be arranged on the first top metal 366 of the device 300. In particular aspects, the forming the solder 708 may include forming the first solder portion 390 with a screen printing method, a stencil method, and/or the like onto the device 300, the first top metal 366, the upper surface 322, and/or the like.

In particular aspects, the forming the solder 708 may include forming the second solder portion 392. More specifically, the second solder portion 392 may be constructed, configured, and/or arranged as described herein. In aspects, the second solder portion 392 may be arranged on the second top metal 368 of the device 300. In particular aspects, the forming the solder 708 may include forming the second solder portion 392 with a screen printing method, a stencil method, and/or the like onto the device 300, the first top metal 366, the upper surface 322, and/or the like.

The process of forming a device 700 may include arranging at least one SiC SMD component on the device 710. In particular aspects, the arranging at least one SiC SMD component on the device 710 may include arranging the at least one SiC SMD component 200 on the device 300 as described herein.

In particular aspects, the arranging at least one SiC SMD component on the device 710 may include arranging the at least one SiC SMD component 200 such that the first bottom-side metallization 240 of the at least one SiC SMD component 200 may be arranged on the first solder portion 390. In particular aspects, the arranging at least one SiC SMD component on the device 710 may include arranging the at least one SiC SMD component 200 such that the second bottom-side metallization 242 of the at least one SiC SMD component 200 may be arranged on the second solder portion 392.

In particular aspects, the arranging at least one SiC SMD component on the device 710 may include flipping and arranging the at least one SiC SMD component 200 such that the first top-side metallization 266 of the at least one SiC SMD component 200 may be arranged on the first solder portion 390 and the second top-side metallization 268 of the at least one SiC SMD component 200 may be arranged on the second solder portion 392. In this regard, the aspect of the at least one SiC SMD component 200 illustrated in FIG. 12 is shown prior to being flipped. Further, patterned top SMD-like leads may be implemented by the first top-side metallization 266 and the second top-side metallization 268. Thereafter, the aspect of the at least one SiC SMD component 200 illustrated in FIG. 12 may be attached to the device 300 as illustrated in FIG. 13.

In one aspect, the arranging at least one SiC SMD component on the device 710 may include processing utilizing a surface mount technology (SMT) line. A surface mount technology (SMT) line may utilize numerous processes including solder printing, component placement, solder reflow, and/or the like. Additional processes may include a flux cleaning step to remove all flux residues, wire bonding, dicing, mounting to dicing tape, dicing, either mechanical sawing or laser cutting, or a combination of both, and component testing. Additionally, the at least one SiC SMD component 200 may be arranged on dicing tape that may then serve as input for the Die Attach equipment to place the at least one SiC SMD component 200 on the device 300.

The process of forming a device 700 may include reflowing the solder 712. In aspects, the reflowing the solder 712 may include reflowing the first solder portion 390 and/or the second solder portion 392. In aspects, the reflowing the solder 712 may include reflowing the solder such that the solder flows away from any metal openings and gaps of the device 300. In particular, the solder of the first solder portion 390 and the second solder portion 392 may also be arranged and configured such that the solder also flows away from any metal openings and gaps between the first top metal 366 and the second top metal 368 of the device 300. The reflowing the solder 712 may utilize a self-aligning nature of a solder reflow. The reflowing the solder 712 may allow for more accurate attach placement of the at least one SiC SMD component 200 on the device 300. In this regard, a surface tension of the solder tends to the lowest state of surface tension thus aligning the at least one SiC SMD component 200 on the device 300.

Accordingly, the at least one SiC SMD component 200 may be implemented with the circuit 290 as a capacitor, a spiral inductor, a transmission line, and/or the like. The at least one SiC SMD component 200 may include a patterned bottom-side metallization by the first bottom-side metallization 240 and the second bottom-side metallization 242 that may be attached to the device 300, such as PCB (Printed Circuit Board), using a standard solder reflow method and equipment.

Aspects of the disclosure may utilize a solder reflow method to attach the at least one SiC SMD component 200 with greater accuracy. Aspects of the at least one SiC SMD component 200 may utilize a self-aligning nature of a solder reflow method as described in relation to the process of forming a device 700. Moreover, aspects of the at least one SiC SMD component 200 may utilize a self-aligning nature of a solder reflow method as described in relation to the process of forming a device 700, which may be combined with appropriately designed solder mask implemented by the first solder mask 394 and the second solder mask 396 on the device 300, such as a PCB, that may allow for more accurate attach placement of the at least one SiC SMD component 200, smaller placement tolerances of the at least one SiC SMD component 200, and/or the like.

In addition, a lower temperature profile of solder reflow, which may be approximately 260 C., is less harsh on the at least one SiC SMD component 200 and/or the device 300. Accordingly, the at least one SiC SMD component 200 and/or the device 300 may have improved device reliability, device ruggedness, device assembly cost, and/or the like of the attach as compared to epoxy attach, which can need curing temperatures as high as 400 C.

The at least one SiC SMD component 200 may be attached onto the device 300, such as a PCB, which may have routed transmission lines, vias, solder mask, and/or the like. The solder can be applied with screen printing method, a stencil method, and/or the like onto a large PCB panel or other support, and several of the at least one SiC SMD component 200 may be placed and reflowed at the same time. Accordingly, attaching multiple implementations of the at least one SiC SMD component 200 reduces assembly time and cost.

Aspects of the at least one SiC SMD component 200 can have patterned bottom-side metallization such as the first bottom-side metallization 240 and the second bottom-side metallization 242. In aspects, the patterned bottom-side metallization may mimic and/or form leads consistent with typical ceramic surface mount device (SMDs). The at least one SiC SMD component 200 may be designed, configured, implemented, and/or the like to replicate standard SMD component sizes. Accordingly, the disclosed SiC components provide a high temperature capability, a high voltage capability, a low-loss capability, a high-Q capability, and/or the like replacement for standard SMDs. Moreover, the disclosed SiC components may also be designed to any custom size, aspect ratio, footprint, and/or the like as needed.

The at least one SiC SMD component 200 may be configured as a surface mounted SiC Device, such as surface mounted SiC Device arranged on SiC substrate, that may be attached onto the device 300, such as PCB, using a solder reflow method instead of epoxy or the like.

Aspects of the at least one SiC SMD component 200 may be configured with a patterned bottom side implementations of the first bottom-side metallization 240 and the second bottom-side metallization 242 that may be configured in the size and/or form factor of standard SMD units, but the size of the SiC component can also be in customized to any size/aspect ratio or foot-print.

The at least one SiC SMD component 200 may be configured to use a solder mask outline implemented by the first solder mask 394 and the second solder mask 396 to self-align and center the at least one SiC SMD component 200 on the device 300 during an attach process. Aspects of the at least one SiC SMD component 200 may be configured to offer an improved alternative. In this regard, the at least one SiC SMD component 200 may be configured for higher power handling, better reliability, better thermals, and/or the like. Further, the at least one SiC SMD component 200 may be configured to standard outline SMDs such as the SMD Package Types described herein.

The at least one SiC SMD component 200 and/or the device 300 may be configured to use existing tools and knowledge for attaching the at least one SiC SMD component 200 on the device 300. However, the existing tools and knowledge are applied to the disclosed implementation of the at least one SiC SMD component 200 and the device 300. The at least one SiC SMD component 200 may be configured for implementation with a tool for placing a typical SMD component on PCB, which may be re-configured to pick the at least one SiC SMD component 200 from a wafer frame and attach the at least one SiC SMD component 200 on the device 300.

The at least one SiC SMD component 200 may be configured to be placed with bottom pads implemented by the first bottom-side metallization 240 and the second bottom-side metallization 242 configured to contact the device 300. Aspects of the at least one SiC SMD component 200 may be configured to be flip-chipped so top pads of the at least one SiC SMD component 200 contact the device 300. The at least one SiC SMD component 200 may be configured to use a solder reflow method that may be able to handle smaller form factor SIC IPDs in comparison to current epoxy attach methods.

Aspects of the at least one SiC SMD component 200 may beneficially utilize a lower temperature profile of solder reflow, which may be less than 260 C. This may have benefits in comparison to an epoxy cure temperature, which can be as high as 400 C. Accordingly, 200 and/or the device 300 may be configured for better reliability, ruggedness, cost, and/or the like. In this regard, implementation with the reflow solder is cleaner, simpler, less costly, and/or the like. Further, implementation with the reflow solder may not be as good thermally. However, this is not needed for passive devices. In this regard, a surface tension of the solder tends to the lowest state of surface tension thus aligning the at least one SiC SMD component 200 on the device 300.

The at least one SiC SMD component 200 may be configured to be implemented in conjunction with a solder mask on the device 300 that can be used to self-align, center, and/or the like the at least one SiC SMD component 200, and prevent solder flow over to bond-pads of the device 300. Aspects of the at least one SiC SMD component 200 may be configured to be implemented with other tools, equipment, knowledge, and/or the like common for SMD attach on PCB, can be re-applied in the attach of the at least one SiC SMD component 200 onto the device 300.

In aspects, the at least one SiC SMD component 200 may have better thermal handling, higher power handling, better reliability, lifetime, and/or the like in comparison to a typical multi-layer ceramic SMD component. Aspects of the at least one SiC SMD component 200 may be configured to be implemented in any similar form factor, outline, and/or the like as standardized SMDs such as the SMD Package Types described herein, which allows for direct replacement of the at least one SiC SMD component 200 on the device 300.

Accordingly, the disclosure has provided SiC based components configured to implement an improved attachment and an improved attachment process to reduce cost, manufacturing time and/or the like.

In various exemplary aspects, the disclosure may be directed a silicon carbide (SiC) surface mount device (SMD) comprising: a substrate 204; a first metallization (a first top-side metallization 266, a first bottom-side metallization 240); a second metallization (a second top-side metallization

268, a second bottom-side metallization 242); a circuit 290 electrically connected to the first metallization (a first top-side metallization 266, a first bottom-side metallization 240) and the second metallization (a second top-side metallization 268, a second bottom-side metallization 242); and the first metallization (a first top-side metallization 266, a first bottom-side metallization 240) and the second metallization (a second top-side metallization 268, a second bottom-side metallization 242) being configured, structured, and arranged to make a solder connection to a device 300, wherein the substrate 204 comprises silicon carbide (SiC). Wherein the first metallization comprises a first top-side metallization 266; wherein the second metallization comprises a second top-side metallization 268; and wherein the first top-side metallization 266 and the second top-side metallization 268 are configured as SMD leads configured, structured, and arranged to make the solder connection to a device 300. Wherein the circuit 290 is configured to implement a capacitor, an inductor, a spiral inductor, a transmission line, a resistor, and/or a combinations thereof. Wherein the circuit 290 is configured to electrically connect to the first top-side metallization 266 and the second top-side metallization 268. Wherein the circuit 290 is configured to be arranged on the upper surface 222 of the substrate 204. Wherein the device comprises a substrate 304; wherein the substrate 304 comprises a printed circuit board (PCB), a printed wiring board (PWB), and/or a printed circuit board assembly (PCBA); and wherein the first metallization (a first top-side metallization 266, a first bottom-side metallization 240) and the second metallization (a second top-side metallization 268, a second bottom-side metallization 242) being configured, structured, and arranged to make a solder connection to the substrate 304. Wherein the substrate 204 is configured to include an upper surface 222 configured to support the first top-side metallization 266 and the second top-side metallization 268; and wherein first top-side metallization 266 and the second top-side metallization 268 is configured to be arranged on the upper surface 222 of the substrate 204. Wherein the circuit 290 is configured to be arranged on the upper surface 222 of the substrate 204. Wherein the substrate 204 is configured to include a lower surface 224 and the first bottom-side metallization 240 and the second bottom-side metallization 242 located on the lower surface 224 of the substrate 204. Wherein the first metallization comprises a first bottom-side metallization 240; wherein the second metallization comprises a second bottom-side metallization 242; and wherein silicon carbide (SiC) surface mount device (SMD) is configured as a flip Chip device. Wherein the first bottom-side metallization 240 and the second bottom-side metallization 242 are configured as SMD leads configured, structured, and arranged to make a solder connection to a device 300.

In various exemplary aspects, the disclosure may be directed a device 300 implementing the at least one SiC SMD component 200, the device 300 comprising a substrate 304, a first top metal 366, a second top metal 368, a metallization layer 340, a first solder portion 390 arranged on the first top metal 366, and a second solder portion 392 arranged on the second top metal 368. The device 300 further comprising: a first solder mask 394; a second solder mask 396, wherein the first solder mask 394 is arranged on the first top metal 366 of the device 300. Wherein the second solder mask 396 is arranged on the second top metal 368 of the device 300. Wherein the at least one SiC SMD component 200 is configured to be attached to the substrate 304 using the first solder portion 390 and/or the second solder portion 392. Wherein the substrate 304 comprises a printed circuit board (PCB), a printed wiring board (PWB), and/or a printed circuit board assembly (PCBA). Wherein the first solder portion 390 and the second solder portion 392 are configured to contain reflowed solder such that the at least one SiC SMD component 200 self-aligns to a more exact intended placement position on the substrate 304 of the device 300. Wherein the first solder mask 394 comprises a first portion, a second portion, and a third portion; wherein the first portion of the first solder mask 394 is configured to connect to the second portion of the first solder mask 394; and wherein the second portion of the first solder mask 394 is configured to connect to the third portion of the first solder mask 394. Wherein the first portion of the first solder mask 394, the second portion of the first solder mask 394, and the third portion of the first solder mask 394 are configured to form a U-shape on the first top metal 366; and wherein the first solder portion 390 is configured to be arranged on the first top metal 366 of the device 300. Wherein the first solder portion 390 comprises a first portion, a second portion, and a third portion. Wherein the first portion of the first solder portion 390 is configured to connect to the second portion of the first solder portion 390; and wherein the second portion of the first solder portion 390 is configured to connect to the third portion of the first solder portion 390. Wherein the first portion of the first solder portion 390, the second portion of the first solder portion 390, and the third portion of the first solder portion 390 is configured to form a U-shape on the first top metal 366; wherein the second solder mask 396 is configured to be arranged on the second top metal 368 of the device 300; and wherein the second solder mask 396 is configured to be arranged adjacent the second top-side metallization 268 of the at least one SiC SMD component 200 with a first portion, a second portion, and a third portion. Wherein the first portion of the second solder mask 396 is configured to connect to the second portion of the second solder mask 396; and wherein the second portion of the second solder mask 396 is configured to connect to the third portion of the second solder mask 396. Wherein the first portion of the second solder portion 392 is configured to connect to the second portion of the second solder portion 392; and wherein the second portion of the second solder portion 392 is configured to connect to the third portion of the second solder portion 392. Wherein the first portion of the second solder portion 392, the second portion of the second solder portion 392, and the third portion of the second solder portion 392 is configured to form a U-shape on the first top metal 366. Wherein the first solder mask 394, the second solder mask 396, the first solder portion 390, and the second solder portion 392 is configured to be configured and/or arranged on the device 300 such that the at least one SiC SMD component 200 aligns and centers itself on the device 300 after solder reflow of the first solder portion 390 and the second solder portion 392. Wherein the first solder portion 390 and the second solder portion 392 is configured to also be arranged and configured such that solder also flows away from any metal openings and gaps of the device 300. Wherein the at least one SiC SMD component 200 is configured to be flipped. Wherein the first top-side metallization 266 and the second top-side metallization 268, form leads for making contact to the device 300. Wherein the at least one SiC SMD component 200 is configured to be configured to implement the circuit 290 to form a Metal-Insulator-Metal (MIM) capacitor with a first metal 264 and a second metal 274 having a dielectric layer 262 therebetween.

The following are a number of nonlimiting EXAMPLES of aspects of the disclosure.

One EXAMPLE includes: the silicon carbide surface mount device includes a substrate. The silicon carbide surface mount device in addition includes a first metallization arranged on the substrate. The silicon carbide surface mount device moreover includes a second metallization arranged on the substrate. The silicon carbide surface mount device also includes a circuit arranged on the substrate and electrically connected to the first metallization and the second metallization. The silicon carbide surface mount device further includes the first metallization and the second metallization being configured, structured, and arranged to make a solder connection to a device. The silicon carbide surface mount device in addition includes where the substrate may include silicon carbide (SiC).

The above-noted EXAMPLE may further include any one or a combination of more than one of the following EXAMPLES: The silicon carbide surface mount device of the above-noted EXAMPLE where the first metallization may include a first top-side metallization; and where the second metallization may include a second top-side metallization. The silicon carbide surface mount device of the above-noted EXAMPLE where the circuit is configured to electrically connect to the first top-side metallization and the second top-side metallization. The silicon carbide surface mount device of the above-noted EXAMPLE where silicon carbide (SiC) surface mount device (SMD) is configured as a flip Chip device; and where the first top-side metallization and the second top-side metallization are configured as SMD leads configured, structured, and arranged to make the solder connection to the device. The silicon carbide surface mount device of the above-noted EXAMPLE where the first bottom-side metallization and the second bottom-side metallization are configured as SMD leads configured, structured, and arranged to make the solder connection to the device. The silicon carbide surface mount device of the above-noted EXAMPLE where the device may include a substrate; where the substrate may include a printed circuit board (PCB), a printed wiring board (PWB), and/or a printed circuit board assembly (PCBA); and where the first metallization and the second metallization being configured, structured, and arranged to make a solder connection to the substrate. The silicon carbide surface mount device of the above-noted EXAMPLE where the circuit is configured to implement a capacitor, an inductor, a spiral inductor, a transmission line, a resistor, and/or a combinations thereof. The silicon carbide surface mount device of the above-noted EXAMPLE where the silicon carbide (SiC) surface mount device (SMD) is configured to be configured to implement the circuit to form a Metal-Insulator-Metal (MIM) capacitor with a first metal and a second metal having a dielectric layer therebetween. The device of the above-noted EXAMPLE the device having: a substrate; a first top metal on the substrate; a second top metal on the substrate; a first solder portion arranged on the first top metal; and a second solder portion arranged on the second top metal, where the substrate may include a printed circuit board (PCB), a printed wiring board (PWB), and/or a printed circuit board assembly (PCBA). The device of the above-noted EXAMPLE may include: a first solder mask; and a second solder mask, where the first solder mask is arranged on the first top metal of the device; and where the second solder mask is arranged on the second top metal of the device. The device of the above-noted EXAMPLE where the first solder mask and the second solder mask are configured to contain reflowed solder such that the silicon carbide (SiC) surface mount device (SMD) self-aligns to a more exact intended placement position on the substrate of the device. The device of the above-noted EXAMPLE where the first solder mask may include a first portion, a second portion, and a third portion; where the first portion of the first solder mask is configured to connect to the second portion of the first solder mask; and where the second portion of the first solder mask is configured to connect to the third portion of the first solder mask. The device of the above-noted EXAMPLE where the first portion of the first solder mask, the second portion of the first solder mask, and the third portion of the first solder mask are configured to form a U-shape on the first top metal. The device of the above-noted EXAMPLE where the silicon carbide (SiC) surface mount device (SMD) is configured to be attached to the substrate using the first solder portion and/or the second solder portion.

One EXAMPLE includes: the process includes providing a substrate.

The process in addition includes arranging a first metallization on the substrate. The process moreover includes a second metallization on the substrate. The process also includes arranging a circuit electrically connected to the first metallization and the second metallization. The process further includes reflowing a solder to connect the first metallization and the second metallization to a device. The process in addition includes where the substrate may include silicon carbide (SiC).

The above-noted EXAMPLE may further include any one or a combination of more than one of the following EXAMPLES: The process of the above-noted EXAMPLE where the first metallization may include a first top-side metallization; and where the second metallization may include a second top-side metallization. The process of the above-noted EXAMPLE where silicon carbide (SiC) surface mount device (SMD) is configured as a flip Chip device; and where the first top-side metallization and the second top-side metallization are configured as SMD leads configured, structured, and arranged to make a solder connection to the device. The process of the above-noted EXAMPLE may include electrically connecting the circuit to the first top-side metallization and the second top-side metallization. The process of the above-noted EXAMPLE where the device may include a substrate; where the substrate may include a printed circuit board (PCB), a printed wiring board (PWB), and/or a printed circuit board assembly (PCBA); and where the first metallization and the second metallization being configured, structured, and arranged to make a solder connection to the substrate. The process of the above-noted EXAMPLE where the first metallization may include a first bottom-side metallization; where the second metallization may include a second bottom-side metallization; and where the first bottom-side metallization and the second bottom-side metallization are configured as SMD leads configured, structured, and arranged to make a solder connection to the device. The process of the above-noted EXAMPLE where the circuit is configured to implement a capacitor, an inductor, a spiral inductor, a transmission line, a resistor, and/or a combinations thereof. The process of the above-noted EXAMPLE where the silicon carbide (SiC) surface mount device (SMD) is configured to be configured to implement the circuit to form a Metal-Insulator-Metal (MIM) capacitor with a first metal and a second metal having a dielectric layer therebetween. The process of the above-noted EXAMPLE the device having: providing a substrate; arranging a first top metal on the substrate; arranging a second top metal on the substrate; arranging a first solder portion arranged on the first top metal; and arranging a second solder portion arranged on the second top metal, where the substrate may include a printed circuit board (PCB), a printed wiring board (PWB), and/or a printed circuit board assembly (PCBA). The process of the above-noted EXAMPLE may include: arranging a first solder mask on the first top metal of the device; and arranging a second solder mask on the second top metal of the device. The process of the above-noted EXAMPLE where the first solder mask and the second solder mask are configured to contain reflowed solder such that the silicon carbide (SiC) surface mount device (SMD) self-aligns to a more exact intended placement position on the substrate of the device. The process of the above-noted EXAMPLE where the first solder mask may include a first portion, a second portion, and a third portion; where the first portion of the first solder mask is configured to connect to the second portion of the first solder mask; and where the second portion of the first solder mask is configured to connect to the third portion of the first solder mask. The process of the above-noted EXAMPLE where the first portion of the first solder mask, the second portion of the first solder mask, and the third portion of the first solder mask are configured to form a U-shape on the first top metal. The process of the above-noted EXAMPLE where the silicon carbide (SiC) surface mount device (SMD) is configured to be attached to the substrate using the first solder portion and/or the second solder portion.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A silicon carbide (SiC) surface mount device (SMD) comprising:
   a substrate comprising a first surface and a second surface opposite the first surface;
   a first metallization arranged on the first surface and the second surface of the substrate;
   a second metallization arranged on the first surface and the second surface of the substrate;
   a circuit arranged on the substrate and electrically connected to the first metallization and the second metallization; and
   the first metallization and the second metallization being configured, structured, and arranged to make a solder connection to a device,
   wherein the substrate comprises silicon carbide (SiC).

2. The silicon carbide (SiC) surface mount device (SMD) according to claim 1
   wherein the circuit is on the first surface of the substrate;
   wherein the first metallization comprises a first top-side metallization; and
   wherein the second metallization comprises a second top-side metallization.

3. The silicon carbide (SiC) surface mount device (SMD) according to claim 2
   wherein the circuit is on the first surface of the substrate and the circuit is configured to electrically connect to the first top-side metallization and the second top-side metallization.

4. The silicon carbide (SiC) surface mount device (SMD) according to claim 2
   wherein the silicon carbide (SiC) surface mount device (SMD) is configured as a flip Chip device; and wherein the first top-side metallization and the second top-side metallization are configured as SMD leads configured, structured, and arranged to make the solder connection to the device.

5. The silicon carbide (SiC) surface mount device (SMD) according to claim 1
   wherein the first metallization comprises a first bottom-side metallization and a first top-side metallization;
   wherein the second metallization comprises a second bottom-side metallization and a second top-side metallization; and
   wherein the substrate comprises at least one via connected to the first bottom-side metallization and the first top-side metallization and/or wherein the substrate comprises at least one via connected to the second bottom-side metallization and the second top-side metallization.

6. The silicon carbide (SiC) surface mount device (SMD) according to claim 1
   wherein the device comprises a device substrate;
   wherein the device substrate comprises a printed circuit board (PCB), a printed wiring board (PWB), and/or a printed circuit board assembly (PCBA); and
   wherein the first metallization and the second metallization being configured, structured, and arranged to make a solder connection to the device substrate.

7. The silicon carbide (SiC) surface mount device (SMD) according to claim 1
   wherein the substrate comprises at least one via connected to the first metallization and/or the second metallization; and
   wherein the circuit comprises at least a capacitor, an inductor, a spiral inductor, a transmission line, a resistor, and/or combinations thereof.

8. The silicon carbide (SiC) surface mount device (SMD) according to claim 1
   wherein the substrate comprises at least one via connected to the first metallization and/or the second metallization; and
   wherein the silicon carbide (SiC) surface mount device (SMD) comprises at least a Metal-Insulator-Metal (MIM) capacitor with a first metal and a second metal having a dielectric layer therebetween.

9. A device implementing the silicon carbide (SiC) surface mount device (SMD) according to claim 1, the device comprising:
   a device substrate;
   a first top metal on the device substrate;
   a second top metal on the device substrate;
   a first solder portion arranged on the first top metal; and
   a second solder portion arranged on the second top metal,
   wherein the device substrate comprises a printed circuit board (PCB), a printed wiring board (PWB), and/or a printed circuit board assembly (PCBA).

10. The device implementing the silicon carbide (SiC) surface mount device (SMD) according to claim 9 further comprising:
   a first solder mask; and
   a second solder mask,
   wherein the first solder mask is arranged on the first top metal of the device; and
   wherein the second solder mask is arranged on the second top metal of the device.

11. The device implementing the silicon carbide (SiC) surface mount device (SMD) according to claim 10 wherein the first solder mask and the second solder mask are configured to contain reflowed solder such that the silicon carbide (SiC) surface mount device (SMD) self-aligns to a more exact intended placement position on the device substrate of the device.

12. The device implementing the silicon carbide (SiC) surface mount device (SMD) according to claim 10
    wherein the first solder mask comprises a first portion, a second portion, and a third portion;
    wherein the first portion of the first solder mask is configured to connect to the second portion of the first solder mask; and
    wherein the second portion of the first solder mask is configured to connect to the third portion of the first solder mask.

13. The device implementing the silicon carbide (SiC) surface mount device (SMD) according to claim 12 wherein the first portion of the first solder mask, the second portion of the first solder mask, and the third portion of the first solder mask are configured to form a U-shape on the first top metal.

14. The device implementing the silicon carbide (SiC) surface mount device (SMD) according to claim 9 wherein the silicon carbide (SiC) surface mount device (SMD) is configured to be attached to the device substrate using the first solder portion and/or the second solder portion.

15. The silicon carbide (SiC) surface mount device (SMD) according to claim 1 wherein the substrate comprises semi-insulating silicon carbide.

16. A process of implementing a silicon carbide (SiC) surface mount device (SMD) comprising:
    providing a substrate comprising a first surface and a second surface opposite the first surface;
    arranging a first metallization on the first surface and the second surface of the substrate;
    arranging a second metallization on the first surface and the second surface of the substrate;
    arranging a circuit electrically connected to the first metallization and the second metallization; and
    reflowing a solder to connect the first metallization and the second metallization to a device,
    wherein the substrate comprises silicon carbide (SiC).

17. The process of implementing a silicon carbide (SiC) surface mount device (SMD) according to claim 16
    wherein the circuit is on the first surface of the substrate;
    wherein the first metallization comprises a first top-side metallization; and
    wherein the second metallization comprises a second top-side metallization.

18. The process of implementing a silicon carbide (SiC) surface mount device (SMD) according to claim 17
    wherein the silicon carbide (SiC) surface mount device (SMD) is configured as a flip Chip device; and
    wherein the first top-side metallization and the second top-side metallization are configured, structured, and arranged to make a solder connection to the device.

19. The process of implementing a silicon carbide (SiC) surface mount device (SMD) according to claim 17 further comprising electrically connecting the circuit to the first top-side metallization and the second top-side metallization.

20. The process of implementing a silicon carbide (SiC) surface mount device (SMD) according to claim 16
    wherein the device comprises a device substrate;
    wherein the device substrate comprises a printed circuit board (PCB), a printed wiring board (PWB), and/or a printed circuit board assembly (PCBA); and
    wherein the first metallization and the second metallization being configured, structured, and arranged to make a solder connection to the device substrate.

21. The process of implementing a silicon carbide (SiC) surface mount device (SMD) according to claim 16
    wherein the first metallization comprises a first bottom-side metallization and a first top-side metallization;
    wherein the second metallization comprises a second bottom-side metallization and a second top-side metallization; and
    wherein the substrate comprises at least one via connected to the first bottom-side metallization and the first top-side metallization and/or wherein the substrate comprises at least one via connected to the second bottom-side metallization and the second top-side metallization.

22. The process of implementing a silicon carbide (SIC) surface mount device (SMD) according to claim 16
    wherein the substrate comprises at least one via connected to the first metallization and/or the second metallization; and
    wherein the circuit comprises at least a capacitor, an inductor, a spiral inductor, a transmission line, a resistor, and/or a combinations thereof.

23. The process of implementing a silicon carbide (SiC) surface mount device (SMD) according to claim 16
    wherein the substrate comprises at least one via connected to the first metallization and/or the second metallization; and
    wherein the silicon carbide (SiC) surface mount device (SMD) comprises at least a Metal-Insulator-Metal (MIM) capacitor with a first metal and a second metal having a dielectric layer therebetween.

24. A process of implementing a device implementing the silicon carbide (SiC) surface mount device (SMD) according to claim 16, the process of implementing a device comprising:
    providing a device substrate;
    arranging a first top metal on the device substrate;
    arranging a second top metal on the device substrate;
    arranging a first solder portion arranged on the first top metal; and
    arranging a second solder portion arranged on the second top metal,
    wherein the device substrate comprises a printed circuit board (PCB), a printed wiring board (PWB), and/or a printed circuit board assembly (PCBA).

25. The process of implementing a device implementing the silicon carbide (SiC) surface mount device (SMD) according to claim 24 further comprising:
    arranging a first solder mask on the first top metal of the device; and
    arranging a second solder mask on the second top metal of the device.

26. The process of implementing a device implementing the silicon carbide (SiC) surface mount device (SMD) according to claim 25 wherein the first solder mask and the second solder mask are configured to contain reflowed solder such that the silicon carbide (SiC) surface mount device (SMD) self-aligns to a more exact intended placement position on the device substrate of the device.

27. The process of implementing a device implementing the silicon carbide (SiC) surface mount device (SMD) according to claim 25
    wherein the first solder mask comprises a first portion, a second portion, and a third portion;
    wherein the first portion of the first solder mask is configured to connect to the second portion of the first solder mask; and wherein the second portion of the first solder mask is configured to connect to the third portion of the first solder mask.

28. The process of implementing a device implementing the silicon carbide (SiC) surface mount device (SMD) according to claim 27 wherein the first portion of the first solder mask, the second portion of the first solder mask, and the third portion of the first solder mask are configured to form a U-shape on the first top metal.

29. The process of implementing a silicon carbide (SiC) surface mount device (SMD) according to claim 16 wherein the substrate comprises semi-insulating silicon carbide.

30. The process of implementing a device implementing the silicon carbide (SiC) surface mount device (SMD) according to claim 24 wherein the silicon carbide (SiC) surface mount device (SMD) is configured to be attached to the device substrate using the first solder portion and/or the second solder portion.

31. A device comprising:

a silicon carbide substrate comprising a first surface and a second surface opposite the first surface;

a first metallization on the first surface and the second surface of the silicon carbide substrate a first via between the first surface and the second surface and electrically connecting the first metallization on the first surface and the second surface;

a second metallization on the first surface and the second surface of the silicon carbide substrate;

a second via between the first surface and the second surface and electrically connecting the second metallization on the first surface and the second surface a circuit on the first surface of the silicon carbide substrate and electrically connected to the first metallization and the second metallization; and a device substrate comprising a first solder connection with the first metallization and a second solder connection with the second metallization.

32. The device according to claim 31 wherein the silicon carbide substrate comprises semi-insulating silicon carbide.

\* \* \* \* \*